(12) United States Patent
Tateishi

(10) Patent No.: US 12,295,179 B2
(45) Date of Patent: May 6, 2025

(54) LIGHT DETECTING ELEMENT AND PHOTOELECTRIC CONVERSION DEVICE

(71) Applicant: CANON KABUSHIKI KAISHA, Tokyo (JP)

(72) Inventor: Yoshinori Tateishi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 974 days.

(21) Appl. No.: 17/367,891

(22) Filed: Jul. 6, 2021

(65) Prior Publication Data

US 2022/0028913 A1    Jan. 27, 2022

(30) Foreign Application Priority Data

Jul. 22, 2020 (JP) ................... 2020-125462

(51) Int. Cl.
*H10F 39/00* (2025.01)
*G01S 17/931* (2020.01)

(52) U.S. Cl.
CPC ........ *H10F 39/8063* (2025.01); *G01S 17/931* (2020.01); *H10F 39/8067* (2025.01); *H10F 39/811* (2025.01)

(58) Field of Classification Search
CPC .................. H01L 27/14629; H01L 31/022491
See application file for complete search history.

(56) References Cited

U.S. PATENT DOCUMENTS

| | | |
|---|---|---|
| 8,586,976 B2 | 11/2013 | Matsuura et al. |
| 10,746,592 B2 | 8/2020 | Nakajima |
| 11,339,494 B2 | 5/2022 | Nakajima |
| 2011/0259414 A1* | 10/2011 | Lim ............... H01L 31/056 136/256 |
| 2012/0138140 A1 | 6/2012 | Kihara et al. |
| 2014/0130857 A1 | 5/2014 | Narita et al. |
| 2020/0052156 A1 | 2/2020 | Kang et al. |

FOREIGN PATENT DOCUMENTS

| | | |
|---|---|---|
| CN | 108074943 A | 5/2018 |
| EP | 2 657 978 A1 | 10/2013 |
| JP | 64-36083 A | 2/1989 |
| JP | 2011-171513 A | 9/2011 |

(Continued)

OTHER PUBLICATIONS

WO 2012/105155, 2014/0130857 A1.
JP 2012-124264, 2012/0138140 A1.

*Primary Examiner* — Tucker J Wright
(74) *Attorney, Agent, or Firm* — Venable LLP

(57) ABSTRACT

The disclosed light detecting element includes a first electrode, a second electrode, and a photoelectric conversion film arranged between the first electrode and the second electrode. The first electrode includes a first metal layer, a second metal layer arranged between the first metal layer and the photoelectric conversion film, and an oxide layer arranged between the second metal layer and the photoelectric conversion film and formed of an oxide of a metal that the second metal layer contains as a main component. The reflectance at the first electrode with respect to light having a certain wavelength transmitted through the photoelectric conversion film is higher than a reflectance specific to a material forming the second metal layer with respect to light having the certain wavelength.

21 Claims, 10 Drawing Sheets

(56) References Cited

FOREIGN PATENT DOCUMENTS

| | | |
|---|---|---|
| JP | 2012-69286 A | 4/2012 |
| JP | 2012-124264 A | 6/2012 |
| JP | 2015-103768 A | 6/2015 |
| JP | 2016-15375 A | 1/2016 |
| JP | 2018-152369 A | 9/2018 |
| KR | 10-0793314 B1 | 1/2008 |
| WO | 2012/105155 A1 | 8/2012 |

\* cited by examiner

LIGHT DETECTING ELEMENT AND PHOTOELECTRIC CONVERSION DEVICE

BACKGROUND OF THE INVENTION

Field of the Invention

The present invention relates to a light detecting element and a photoelectric conversion device.

Description of the Related Art

As a photoelectric conversion device used in an image sensor or the like of a camera, a stacked photoelectric conversion device has been proposed. In a stacked photoelectric conversion device, a light detecting element including a photoelectric conversion film is stacked over a semiconductor substrate. A transparent electrode is disposed over the photoelectric conversion film, and a pixel electrode is disposed under the photoelectric conversion film. Japanese Patent Application Laid-Open No. 2012-124264 discloses a light detecting element in which a metal electrode layer having an aluminum layer on its surface, an electron extraction layer of a zinc oxide layer, a photoelectric conversion layer, and a transparent electrode layer are stacked in this order.

As a method of improving the light utilization efficiency of a light detecting element using a photoelectric conversion film, a method is known in which a pixel electrode is formed of a metal material having high reflectance, and light reflected by the pixel electrode is efficiently used. However, in the structure described in Japanese Patent Application Laid-Open No. 2012-124264, since a zinc oxide layer is provided between the metal electrode layer and the photoelectric conversion layer, light reflected by the pixel electrode cannot be efficiently used.

SUMMARY OF THE INVENTION

An object of the present invention is to provide a light detecting element with high light utilization efficiency and a photoelectric conversion device with high sensitivity using the light detecting element.

According to an aspect of the present invention, there is provided a light detecting element including a first electrode, a second electrode, and a photoelectric conversion film arranged between the first electrode and the second electrode, wherein the first electrode includes a first metal layer, a second metal layer arranged between the first metal layer and the photoelectric conversion film, and an oxide layer arranged between the second metal layer and the photoelectric conversion film and formed of an oxide of a metal that the second metal layer contains as a main component, and wherein a reflectance at the first electrode with respect to light having a certain wavelength transmitted through the photoelectric conversion film is higher than a reflectance specific to a material forming the second metal layer with respect to light having the certain wavelength.

According to another aspect of the present invention, there is provided a light detecting element including a first electrode, a second electrode, and a photoelectric conversion film arranged between the first electrode and the second electrode, wherein the first electrode includes a first metal layer and a second metal layer arranged between the first metal layer and the photoelectric conversion film, wherein the first metal layer is formed of a metal or an alloy containing aluminum or silver as a main component, and wherein a thickness of the second metal layer is not less than 5 nm and not more than 50 nm.

According to still another aspect of the present invention, there is provided a light detecting element including a first electrode, a second electrode, and a photoelectric conversion film arranged between the first electrode and the second electrode, wherein the first electrode includes a first metal layer and a second metal layer arranged between the first metal layer and the photoelectric conversion film, and wherein a reflectance of the first electrode with respect to light having a certain wavelength transmitted through the photoelectric conversion film is not less than 0.6.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
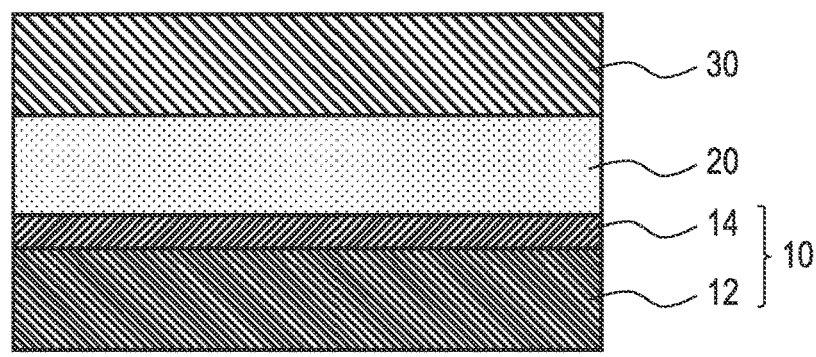
FIG. 1 is a schematic cross-sectional view illustrating a light detecting element according to a first embodiment of the present invention.
Figure 2:
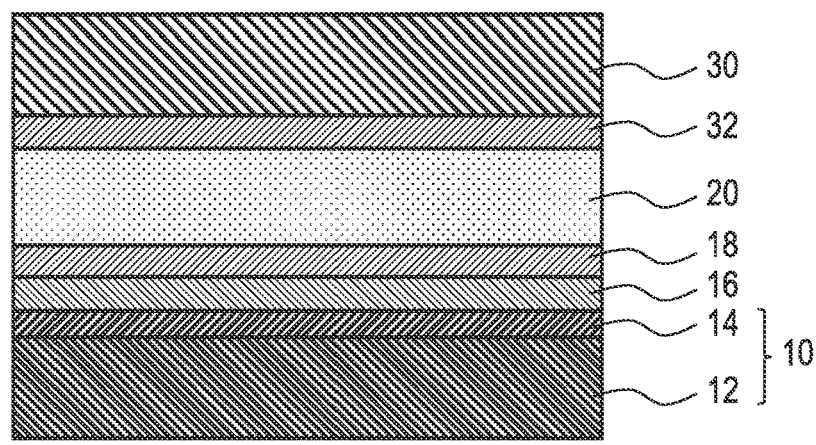
FIG. 2 is a schematic cross-sectional view illustrating a light detecting element according to a modified example of the first embodiment of the present invention.

A light detecting element according to a first embodiment of the present invention will be described with reference to FIG. 1 and FIG. 2. FIG. 1 is a schematic cross-sectional view illustrating a structure of a light detecting element according to the present embodiment. FIG. 2 is a schematic cross-sectional view illustrating a structure of a light detecting element according to a modified example of the present embodiment.

As illustrated in FIG. 1, the light detecting element according to the present embodiment includes a first electrode 10, a second electrode 30, and a photoelectric conversion film 20 provided between the first electrode 10 and the second electrode 30. The first electrode 10 includes a first metal layer 12 and a second metal layer 14 provided between the first metal layer 12 and the photoelectric conversion film 20. The second metal layer 14 is provided in direct contact with the first metal layer 12.

The light detecting element of the present embodiment is configured such that light to be detected passes through the second electrode 30 and enters the photoelectric conversion film 20. The photoelectric conversion film 20 is formed of a photoelectric conversion material, and generates charge corresponding to the amount of incident light. A predetermined bias voltage is applied between the first electrode 10 and the second electrode 30 and charge generated in the photoelectric conversion film 20 is collected via the first electrode 10 and the second electrode 30, whereby a signal corresponding to the amount of charge generated in the photoelectric conversion film 20 may be extracted to the outside.

The first electrode 10 is an electrode for collecting charge (electrons) generated in the photoelectric conversion film 20, and has conductivity. In the present embodiment, the first electrode 10 is an anode, and a material suitable for collecting electrons, i.e., a metal material having a small work function, e.g., a work function of 4.5 eV or less, is preferably used as the metal material constituting the first metal layer 12 and the second metal layer 14. Further, the first electrode 10 may have a function as a reflection film for reflecting light that has reached the first electrode 10 without being absorbed by the photoelectric conversion film 20 and entering the photoelectric conversion film 20 again. With this configuration, the utilization efficiency of incident light may be enhanced.

Of the first metal layer 12 and the second metal layer 14 constituting the first electrode 10, the function as a reflection film may be mainly provided by the first metal layer 12. From such a viewpoint, the first metal layer 12 may be selected from metals or alloys having high reflectance of light corresponding to the absorption wavelength band of the photoelectric conversion film 20. For example, when visible light is detected by the light detecting element, a metal such as aluminum (Al) or silver (Ag) or an alloy thereof may be applied as the main material of the first metal layer 12. The film thickness of the first metal layer 12 is not particularly limited, and may be suitably determined in consideration of a constituent material, required conductivity, and the like, but is generally about 10 nm to 10 μm.

The second metal layer 14 is thinner than the first metal layer 12 and may serve as an antioxidation layer to protect the first metal layer 12, for example, to prevent the first metal layer 12 from being oxidized during the manufacturing process of the light detecting element. By providing the second metal layer 14, it is possible to suppress an increase in contact resistance between the photoelectric conversion film 20 and the first electrode 10 due to oxidation of the first metal layer 12, and to increase the collection efficiency of charge generated in the photoelectric conversion film 20. As the main material of the second metal layer 14, for example, a metal such as titanium (Ti), zinc (Zn), zirconium (Zr), tantalum (Ta), or an alloy thereof may be applied. The oxides of these metal materials constituting the second metal layer 14 may have n-type semiconductor properties, and may function as a layer that blocks holes and conducts only electrons (hole blocking layer). Therefore, even if the second metal layer 14 is oxidized in the manufacturing process of the light detecting element, collection of electrons is not hindered by the formed metal oxide layer.

Although the second metal layer 14 is preferably formed of a metal material from the viewpoint of reducing the contact resistance between the first electrode 10 and the photoelectric conversion film 20, if the second metal layer 14 is too thick, the light absorptance becomes high and the reflection effect by the first metal layer 12 cannot be sufficiently obtained. From this viewpoint, the film thickness of the second metal layer 14 is preferably set to 50 nm or less. In the case where a metal thin film is formed by a vapor phase growth method, a transition is made from nucleation to film formation at the initial stage of growth, but a film thickness of less than about 5 nm is a nucleation stage and is insufficient as a protection layer. Therefore, the thickness of the second metal layer 14 is preferably at least not less than 5 nm. When the second metal layer 14 is formed by a film forming method with high film quality controllability such as atomic layer deposition (ALD) method, the thickness of the second metal layer 14 may be less than 5 nm. However, in order to develop a practical function of the second metal layer 14 itself, the thickness of the second metal layer 14 is preferably at least not less than 1 nm.

By setting the film thickness of the second metal layer 14 to 50 nm or less, the reflectance of the photoelectric conversion film 20 side of the first electrode 10 in the absorption wavelength band of the photoelectric conversion film 20 may be made higher than the reflectance of the material constituting the second metal layer 14. Alternatively, the reflectance of the first electrode 10 with respect to light having a certain wavelength (e.g., 940 nm) transmitted through the photoelectric conversion film 20 may be higher than the reflectance specific to the material forming the second metal layer 14 with respect to light having the certain wavelength. The reflectance of the first electrode 10 on the photoelectric conversion film 20 side is a reflectance when light is incident on the stacked structure of the first metal layer 12 and the second metal layer 14 from the photoelectric conversion film 20 side. The reflectance specific to the material constituting the second metal layer 14 is a reflectance when the material constituting the second metal layer 14 has a sufficient thickness to block incident light (reflectance of bulk material).

As described above, the photoelectric conversion film 20 is formed of a photoelectric conversion material. The photoelectric conversion material constituting the photoelectric conversion film 20 is not particularly limited, and for example, quantum dots which are aggregates of nanoparticles such as amorphous silicon, organic semiconductors, and compound semiconductors may be applied. Examples of suitable organic semiconductors include fullerene ($C_{60}$), coumarin 6 ($C_6$), rhodamine 6G (R6G), quinacridone, phthalocyanine system, naphthalocyanine system, and the like. In the present embodiment, the photoelectric conversion film 20 is formed by using colloidal quantum dots which are nanoparticles of a compound semiconductor material.

Colloidal quantum dots are comprised of nanoparticles (typically, an average particle diameter of not less than 0.5 nm and less than 100 nm). Examples of the constituent material of the nanoparticles include general semiconductor materials, for example, group IV semiconductors, group III-V compound semiconductors, group II-VI compound semiconductors, and compound semiconductors formed of a combination of three or more of group II, group III, group IV, group V and group VI elements. Specifically, for example, semiconductor materials such as PbS, PbSe, PbTe, InN, InAs, InP, InSb, InGaAs, CdS, CdSe, CdTe, Ge, CuInS, CuInSe, CuInGaSe or Si may be used. The quantum dots formed of these semiconductor materials are also called semiconductor quantum dots.

The photoelectric conversion film 20 may include at least one kind of semiconductor quantum dots, or may include two or more kinds of semiconductor quantum dots. Each of the nanoparticles may have a core-shell structure comprising a core formed of semiconductor quantum dot and a coating material covering the core. A semiconductor quantum dot having a size equal to or smaller than the exciton Bohr radius inherent to each semiconductor material exhibits a quantum size effect and has an energy band gap corresponding to the size. Therefore, by appropriately selecting the size of the semiconductor quantum dot, the energy band gap, that is, the light absorption wavelength may be controlled.

Among these semiconductor quantum dot materials, PbS and PbSe are particularly preferable from the viewpoint of ease of synthesis. Since the exciton Bohr radius of PbS is approximately 18 nm, the average particle diameter of the nanoparticles is preferably in the range of 2 nm to 15 nm from the viewpoints of controlling crystal growth and developing quantum size effects. When the average particle diameter of the nanoparticles is not less than 2 nm, the crystal growth may be easily controlled in the synthesis of the nanoparticles. A transmission electron microscope may be used to measure the particle size of the nanoparticles.

The method of manufacturing the photoelectric conversion film 20 including the aggregate of nanoparticles is not particularly limited. The thickness of the photoelectric conversion film 20 is not particularly limited, but is preferably not less than 10 nm, and more preferably not less than 50 nm, from the viewpoint of obtaining high light absorption characteristics. From the viewpoint of ease of manufacture, the thickness of the photoelectric conversion film 20 is preferably 800 nm or less.

The second electrode 30 is preferably transparent in the absorption wavelength band of the photoelectric conversion film 20 from the viewpoint of transmitting at least a portion of the light to be detected and entering the photoelectric conversion film 20. The constituent material of the second electrode 30 is not particularly limited, but a transparent electrode material formed of, for example, a metal oxide layer containing indium oxide, tin oxide, or the like, or a metal oxide layer containing an oxide in which these are combined (e.g., ITO or IZO) may be applied. Alternatively, the second electrode 30 may be formed of a metal material such as platinum, gold, silver, aluminum, chromium, nickel, copper, titanium, magnesium, and the like, which is thinned to a light-transmitting property. Alternatively, the second electrode 30 may be formed of a conductive composite material in which a conductive material such as carbon black, fullerene, carbon nanotube, graphene, and the like is dispersed in a matrix material such as a polymer binder, and the like. As the constituent material of the second electrode 30, one of the plurality of materials exemplified herein may be used alone, or two or more may be used in a predetermined combination and ratio.

One or more layers having different functions may be further provided between the first electrode 10 and the photoelectric conversion film 20 or between the photoelectric conversion film 20 and the second electrode 30.

For example, as illustrated in FIG. 2, a metal compound layer 16 and an intermediate layer 18 may be further provided between the first electrode 10 and the photoelectric conversion film 20.

The metal compound layer 16 may be a carrier injection blocking layer between the first electrode 10 and the photoelectric conversion film 20 for limiting movement of one carrier of holes and electrons (reserving electrical insulation) and allowing movement of the other carrier (reserving conductivity). The metal compound layer 16 disposed between the first electrode 10 and the photoelectric conversion film 20 may be a layer that blocks holes and conducts electrons (hole blocking layer) when the first electrode 10 is an electrode (anode) that collects electrons as in the present embodiment. One of holes and electrons may be a carrier of a first conductivity type, and the other may be a carrier of a second conductivity type different from the first conductivity type.

The function required for the hole blocking layer is to block holes among the electrons and holes generated in the photoelectric conversion film 20 and transport the electrons to the first electrode 10. Therefore, as a constituent material of the hole blocking layer, a material capable of efficiently transporting electrons generated in the photoelectric conversion film 20 to the first electrode 10 is preferable. That is, the constituent material of the hole blocking layer preferably has electrical properties such as a high electron mobility, a high electric conductivity, a small electron injection barrier with the first electrode 10, and a small electron injection barrier from the photoelectric conversion film 20 to the hole blocking layer. Further, the hole blocking layer preferably has a high transmittance to the light to be detected from the viewpoint of effectively using the light that passes through the photoelectric conversion film 20 and enters the first electrode 10.

From such a viewpoint, as the main material of the hole blocking layer, oxides, nitrides, oxynitrides such as titanium oxide, zinc oxide, zirconium oxynitride, tantalum oxide, and the like having a wide band gap, and n-type semiconductor materials such as fullerene $C_{60}$, and the like are suitable. Among them, an oxide-based material is preferable because the electric conductivity may be easily changed by controlling the film formation condition and the oxidation degree by a process treatment after film formation. At least a part of the hole blocking layer may be a metal oxide layer formed by oxidizing the second metal layer 14.

The intermediate layer 18 is an adhesion layer for suppressing peeling of the photoelectric conversion film 20 caused by poor wettability between the first electrode 10 or the metal compound layer 16 and the photoelectric conversion film 20. The intermediate layer 18 may be formed in a thickness of about 1 nm to 100 nm between the first electrode 10 or the metal compound layer 16 and the photoelectric conversion film 20. Since the intermediate layer 18 is provided between the first electrode 10 and the photoelectric conversion film 20, the intermediate layer 18 is preferably selected from materials having a small influence on the contact resistance between the first electrode 10 and the photoelectric conversion film 20. In one example, the intermediate layer 18 and the metal compound layer 16 may be formed of the same material. A layer having both functions of the metal compound layer 16 and the intermediate layer 18 may be provided between the first electrode 10 and the photoelectric conversion film 20 instead of the metal compound layer 16 and the intermediate layer 18.

As illustrated in FIG. 2, a metal compound layer 32 may be further provided between the photoelectric conversion film 20 and the second electrode 30.

The metal compound layer 32 may be a carrier injection blocking layer between the photoelectric conversion film 20 and the second electrode 30 for limiting movement of one carrier of holes and electrons (reserving electrical insulation) and allowing movement of the other carrier (reserving conductivity). The metal compound layer 32 disposed between the photoelectric conversion film 20 and the second electrode 30 may be a layer that blocks electrons and conducts holes (electron blocking layer) when the second electrode 30 is an electrode (a cathode) that collects holes as in the present embodiment. As the carrier injection blocking layer, an organic material layer may be applied instead of the inorganic material layer such as the metal compound layer 32.

The function required for the electron blocking layer is to block electrons among electrons and holes generated in the photoelectric conversion film 20 and transport the holes to the second electrode 30. Therefore, as a constituent material of the electron blocking layer, a material capable of efficiently transporting holes generated in the photoelectric conversion film 20 to the second electrode 30 is preferable. That is, the constituent material of the electron blocking layer preferably has electrical properties such as high hole mobility, high electric conductivity, small hole injection barrier with the second electrode 30, and small hole injection barrier from the photoelectric conversion film 20 to the electron blocking layer. Further, the electron blocking layer preferably has a high transmittance to the light to be detected so as not to inhibit the incidence of light on the photoelectric conversion film 20.

From this viewpoint, as the main material of the electron blocking layer, a p-type semiconductor material such as an inorganic material such as molybdenum oxide ($MoO_3$), nickel oxide (NiO), and the like or an organic material such as PEDOT:PSS is suitable. PEDOT:PSS is a composite of poly(3,4-ethylenedioxythiophene) (PEDOT) and polystyrene sulfonic acid (PSS).

Although FIG. 2 illustrates an example in which the metal compound layers 16 and 32, and the intermediate layer 18 are provided, only a part of these layers may be provided. A layer having a function different from that of the metal compound layers 16 and 32, and the intermediate layer 18 may be further provided.

Figure 3:
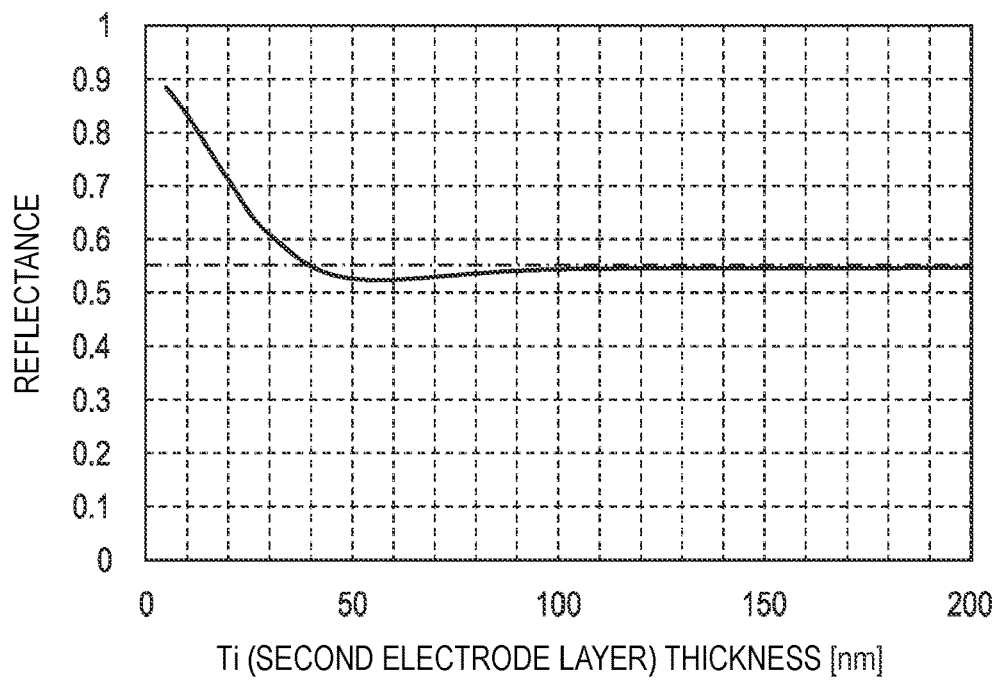
FIG. 3 is a graph illustrating the dependence of reflectance on titanium film thickness in a titanium/aluminum stacked structure.
Figure 4:
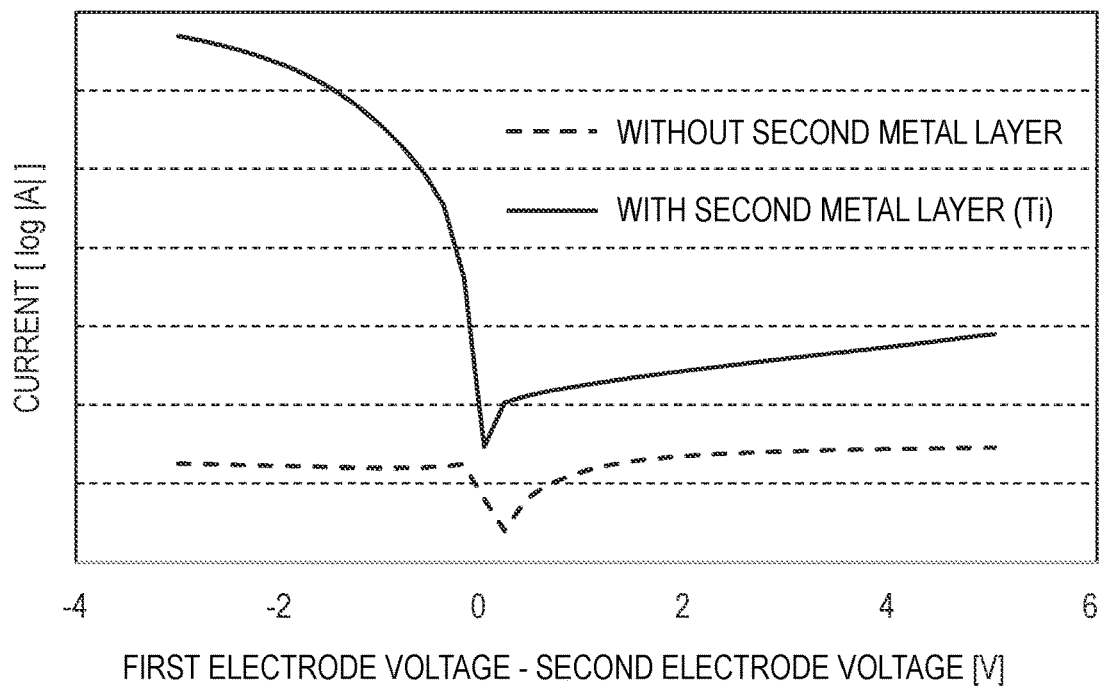
FIG. 4 is a graph illustrating a current-voltage characteristics of the light detecting element.
Figure 5:
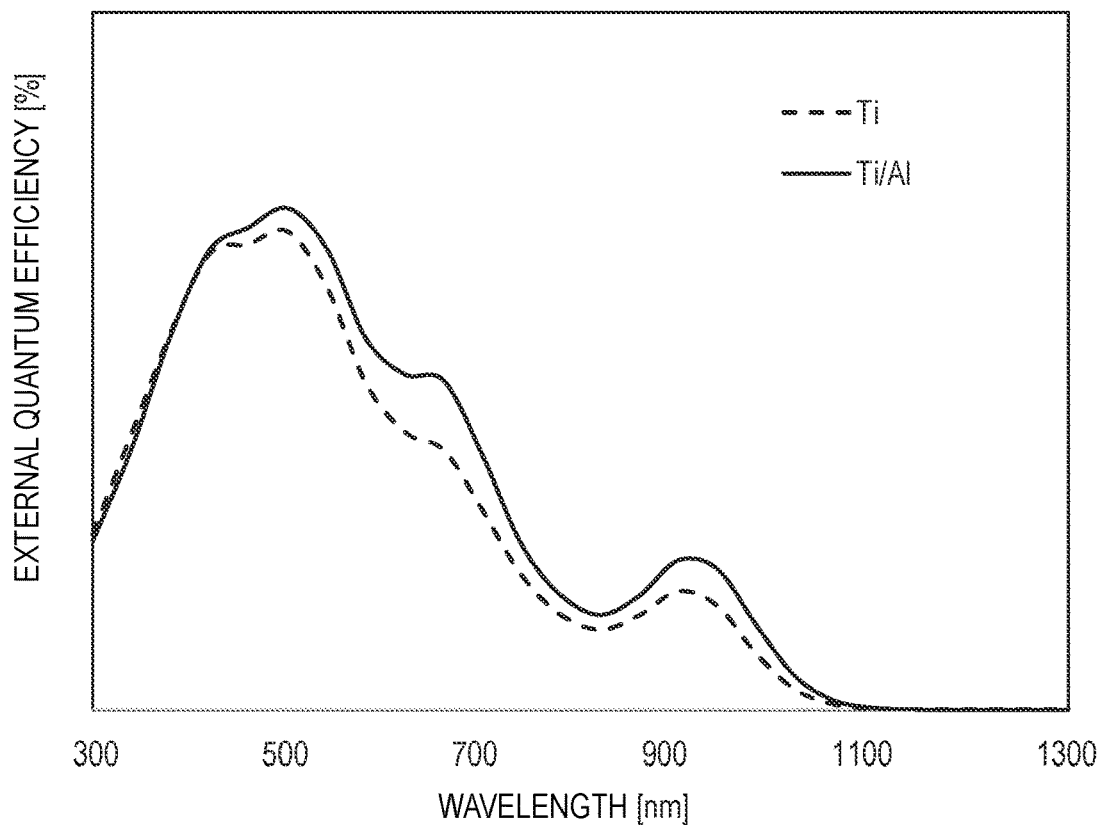
FIG. 5 is a graph illustrating the result of measuring the external quantum efficiency of the light detecting element.

Next, optical properties suitable for the first metal layer 12 and the second metal layer 14 constituting the first electrode 10 will be described in more detail with reference to FIG. 3 to FIG. 5. FIG. 3 is a graph illustrating the dependence of reflectance on titanium film thickness in a titanium/aluminum stacked structure. FIG. 4 is a graph illustrating current-voltage characteristics of the light detecting element. FIG. 5 is a graph illustrating the result of measuring the external quantum efficiency of the light detecting element.

In general, when the light L is incident perpendicularly to the surface of the object O of the material M, and reflection of the light L occurs on the surface of the object O, the light reflectance R specific to the material M on the surface of the object O is expressed by the following Expression (1) where n is the refractive index of the material M and k is the extinction coefficient of the object O.

$$R=\{(n-1)^2+k^2\}/\{(n+1)^2+k^2\} \quad (1)$$

Assuming that the light L is incident perpendicularly to the surface of the second metal layer 14 from the side of the photoelectric conversion film 20, the light reflectance Ra at the surface of the first metal layer 12 and the light reflectance Rb at the surface of the second metal layer 14 are expressed by the following Expressions (2) and (3), respectively. Here, Na is the refractive index of the first metal layer 12, Ka is the extinction coefficient of the first metal layer 12, Nb is the refractive index of the second metal layer 14, and Kb is the extinction coefficient of the second metal layer 14.

$$Ra=\{(Na-1)^2+Ka^2\}/\{(Na+1)^2+Ka^2\} \quad (2)$$

$$Rb=\{(Nb-1)^2+Kb^2\}/\{(Nb+1)^2+Kb^2\} \quad (3)$$

The amount of light L reflected by the first electrode 10 may be increased by increasing the light reflectance Ra of the first metal layer 12. At this time, the light reflectance Rb of the second metal layer 14 may be lower than the light reflectance Ra of the first metal layer 12. That is, the relationship of Ra>Rb may be satisfied. Satisfying the relationship of Ra>Rb means satisfying the relationship of the following Expression (4).

$$\{(Na-1)^2+Ka^2\}/\{(Na+1)^2+Ka^2\}>\{(Nb-1)^2+Kb^2\}/\{(Nb+1)^2+Kb^2\} \quad (4)$$

The Expression (1) is a relational expression when the light L is vertically incident, but the incident angle dependence of the reflectance in the metal layer may be ignored. This is because the incident angle dependence of the reflectance of the incident light on the metal layer is smaller than that of the incident light on the insulator (dielectric).

Here, it is assumed that the intensity of the light L incident on the object O is Is, the intensity of the light L reflected on the surface of the object O is Ir, and the intensity of the light L entering the object O is Ie. Further, of the light entering the object O, the intensity of the light absorbed by the object O is denoted by Ia, and the intensity of the light passing through the object O is denoted by It. Further, let R be the light reflectance at the surface of the object O, τ be the light transmittance of the object O, and A be the light absorptance of the object O. In this case, the intensities Is, Ir, Ie, Ia, and It, the light reflectance R, the light transmittance τ, and the light absorptance A are expressed by the following Expressions (5) to (11).

$$Is=Ir+Ie \quad (5)$$

$$Ie=Ia+It \quad (6)$$

$$Ir=Is\times R \quad (7)$$

$$Ie=Is\times(1-R) \quad (8)$$

$$Ia=Ie\times A \quad (9)$$

$$It=Ie\times(1-A) \quad (10)$$

$$It=Is\times\tau \quad (11)$$

From Expressions (5) to (11), the light transmittance τ of the object O is expressed by the following Expression (12).

$$\tau=It/IS=(1-R)\times(1-A) \quad (12)$$

The intensity It of the transmitted light and the light absorptance A may be expressed by the following Expressions (13) and (14) using the distance d from the incident portion to the exit portion of the light in the object O and the light absorption coefficient α of the material M constituting the object O.

$$It = Ie \times \exp[-\alpha \times d] \tag{13}$$

$$A = (Ie - It)/Ie = 1 - \exp[-\alpha \times d] \tag{14}$$

Here, the relationship between the light absorption coefficient α and the extinction coefficient k is expressed as the following Expression (15), and Expression (14) may be modified as the following Expression (16).

$$\alpha = 4\pi \times k/\lambda \tag{15}$$

$$A = 1 - \exp[-4\pi \times k \times d/\lambda] \tag{16}$$

When the material M is uniform, the light absorptance A depends on the distance d. When the front surface and the back surface of the object O are parallel and the light L is incident perpendicularly to the front surface of the object O, the distance d corresponds to the distance between the front surface and the back surface, that is, the thickness T of the object O.

Here, assuming that the thickness of the second metal layer 14 is Tb, the extinction coefficient of the second metal layer 14 is Kb, and the wavelength of the light L in the second metal layer 14 is λb, the light absorptance Ab of the second metal layer 14 may be expressed by the following Expression (17).

$$Ab = 1 - \exp[-4\pi \times Kb \times Tb/\lambda b] \tag{17}$$

It is effective to reduce the light absorptance Ab of the second metal layer 14. Specifically, the light absorptance Ab of the second metal layer 14 is preferably set to 90% or less (Ab≤0.9).

When light is incident on the photoelectric conversion element through the blue filter CFB, the light incident on the second metal layer 14 is mainly blue light. Therefore, the wavelength λa for evaluating the refractive index Na and the extinction coefficient Ka of the first metal layer 12 is preferably blue light (for example, wavelength 450±10 nm). Since the light incident on the second metal layer 14 may include the light transmitted through the photoelectric conversion film 20, the light is less likely to be absorbed by the photoelectric conversion film 20. For example, when the photoelectric conversion film 20 is a silicon layer, the light incident on the first metal layer 12 is mainly red light. Therefore, the wavelength λb for evaluating the refractive index Nb and the extinction coefficient Kb of the second metal layer 14 is preferably red light (for example, wavelength 630±10 nm).

However, only blue light is not necessarily incident on the first metal layer 12, and only red light is not necessarily incident on the second metal layer 14. Therefore, the refractive index Na and the extinction coefficient Ka of the first metal layer 12 and the refractive index Nb and the extinction coefficient Kb of the second metal layer 14 may be evaluated using a wavelength λc of the green light (for example, a wavelength of 550±10 nm) which is a wavelength between the blue light and the red light.

In order to make the light absorptance Ab of the second metal layer 14 equal to or less than 0.9, it is necessary to satisfy the following Expression (18). The following Expression (18') is obtained by modifying the Expression (18). Further, equation (18") is obtained by substituting the specific values of Napier's constant e and the circumferential ratio π into Expression (18').

$$Ab = 1 - \exp[-4\pi \times Kb \times Tb/\lambda b] \leq 0.9 \tag{18}$$

$$\exp[4\pi \times Kb \times Tb/\lambda b] \leq 10 \tag{18'}$$

$$Kb \times Tb \leq 0.183 \times \lambda b \tag{18''}$$

Table 1 summarizes the refractive index n, the extinction coefficient k, the light reflectance R, and the distance d (d≤0.183λ/k) satisfying the Expression (18") for aluminum (Al), silver (Ag), titanium (Ti), and tantalum (Ta) with respect to blue light, green light, and red light. When the thickness Tb of the second metal layer 14 is in the range of the distance d described in Table 1, the light absorptance Ab of the second metal layer 14 may be 0.9 or less.

TABLE 1

|  | Aluminum (Al) | Silver (Ag) | Titanium (Ti) | Tantalum (Ta) |
|---|---|---|---|---|
| Blue Light | n = 0.6 | n = 0.2 | n = 1.7 | n = 2.8 |
|  | k = 5.5 | k = 2.5 | k = 2.3 | k = 2.1 |
|  | R = 0.9 | R = 0.9 | R = 0.5 | R = 0.4 |
|  | d ≤ 15 nm | d ≤ 33 nm | d ≤ 37 nm | d ≤ 39 nm |
| Green Light | n = 1.0 | n = 0.1 | n = 1.9 | n = 2.5 |
|  | k = 6.7 | k = 3.3 | k = 2.6 | k = 1.8 |
|  | R = 0.9 | R = 1.0 | R = 0.5 | R = 0.4 |
|  | d ≤ 15 nm | d ≤ 30 nm | d ≤ 39 nm | d ≤ 55 nm |
| Red Light | n = 1.4 | n = 0.1 | n = 2.2 | n = 1.7 |
|  | k = 7.6 | k = 4.0 | k = 2.9 | k = 2.1 |
|  | R = 0.9 | R = 1.0 | R = 0.5 | R = 0.4 |
|  | d ≤ 15 nm | d ≤ 29 nm | d ≤ 40 nm | d ≤ 56 nm |

As described in Table 1, aluminum and silver have higher light reflectance R than other materials, and are therefore suitable as materials for the first metal layer 12. Although not described in Table 1, the extinction coefficient k of titanium with respect to infrared light having a wavelength of 940 nm is 3.3. When the second metal layer 14 is formed of titanium, if the distance d is equal to or less than 52 nm, the light absorptance Ab of the second metal layer 14 is equal to or less than 0.9.

FIG. 3 is a graph illustrating dependence of reflectance on titanium film thickness when infrared light having a wavelength of 940 nm is incident on a titanium/aluminum stacked structure in which a titanium film is formed on an aluminum film. The aluminum film assumes the first metal layer 12 and the titanium film assumes the second metal layer 14.

As illustrated in FIG. 3, the reflectance of the titanium/aluminum stacked structure is substantially constant when the thickness of the titanium film is not less than 100 nm. The reflectance when the thickness of the titanium film is not less than 100 nm is slightly lower than 0.55 (illustrated by one-dot chain line in FIG. 3). This value is a specific reflectance of titanium.

When the thickness of the titanium film becomes thinner than 100 nm, the reflectance of the titanium/aluminum stacked structure begins to change. This is because there is light passing through the titanium film. If the base of the titanium film is a low-reflection film having a low reflectance, the reflectance is lower than that in the case of FIG. 3. Therefore, when a titanium film having a thickness of less than 100 nm is formed, the base of the titanium film is preferably formed of a high-reflection film such as aluminum. Note that the reflectance is less than 0.55 when the thickness of the titanium film is in the range of 100 nm to 40 nm due to the influence of interference.

The reflectance of the titanium/aluminum stacked structure is the lowest value when the thickness of the titanium film is 55 nm. When the thickness of the titanium film becomes 50 nm or less, the reflectance of the titanium/aluminum stacked structure becomes higher than that when the thickness of the titanium film is 55 nm. Therefore, the thickness of the titanium film is preferably set to 50 nm or less. When the thickness of the titanium film is set to 40 nm or less, the reflectance is more preferably not less than 0.55 which is higher than the specific reflectance of titanium. Further, it is more preferable that the thickness of the titanium film be 30 nm or less because the reflectance is not less than 0.6. By setting the thickness of the titanium film to 5 nm to 20 nm, the reflectance may be further increased.

Thus, in order to increase the light absorption efficiency in the photoelectric conversion film 20 by utilizing the high reflectance of aluminum, it is desirable to set the thickness of the titanium film (second metal layer 14) to 50 nm or less. In the case where a metal thin film is formed by a vapor phase growth method, a transition is made from nucleation to film formation at the initial stage of growth, but a film thickness of less than about 5 nm is a nucleation stage and is insufficient as a protection layer. Therefore, the film thickness of the second metal layer 14 is preferably at least not less than 5 nm. Although the titanium film was used as the second metal layer 14 here, the same film thickness dependence was obtained when a zinc film or a zirconium film was used as the second metal layer 14.

When the metal compound layer 16, the intermediate layer 18, and the like are formed over the first electrode 10 as in the modified example of the present embodiment illustrated in FIG. 2, for example, the first electrode 10 (the second metal layer 14) may be oxidized during the formation thereof. The thickness of the oxide film formed in this manner varies depending on the conditions for forming the metal compound layer 16 and the intermediate layer 18, but is approximately several nanometers to several tens of nanometers. Therefore, particularly when the metal compound layer 16 or the intermediate layer 18 is provided, the thickness of the second metal layer 14 is preferably set to about 10 nm to 20 nm so that not all of the second metal layer 14 is replaced by the metal oxide layer.

In summary, the thickness of the second metal layer 14 is preferably set in the range of 5 nm to 50 nm, and more preferably in the range of 10 nm to 20 nm.

By configuring the second metal layer 14 in this manner, it is possible to suppress an increase in contact resistance between the first electrode 10 and the photoelectric conversion film 20 while effectively using the reflected light of the first metal layer 12.

FIG. 4 is a graph illustrating the results of measuring the current-voltage characteristics of the light detecting element in the case where the second metal layer 14 is provided and in the case where the second metal layer 14 is not provided. The horizontal axis represents a voltage between the first electrode 10 and the second electrode 30 (first electrode voltage−second electrode voltage), and the vertical axis represents a value of a current flowing between the first electrode 10 and the second electrode 30 on a logarithmic axis (log |I|). In FIG. 4, a solid line represents a measurement result in the structure of the present embodiment in which the second metal layer 14 is provided, and a broken line represents a measurement result in the structure of the comparative example in which the second metal layer 14 is not provided.

As illustrated in FIG. 4, in the structure in which the second metal layer 14 is not provided (broken line), almost no current flows in the voltage range illustrated in FIG. 4. This is considered to be because the first metal layer 12 is oxidized to inhibit the movement of carriers. On the other hand, in the structure of the present embodiment in which the second metal layer 14 was provided (solid line), it was possible to obtain the Schottky barrier diode characteristics as ideal.

FIG. 5 is a graph illustrating the results of measuring the external quantum efficiency in the case where the first electrode 10 is formed of the stacked film of the first metal layer 12 formed of aluminum and the second metal layer 14 formed of titanium and in the case where the first electrode 10 is formed of only the first metal layer 12 formed of titanium. The horizontal axis represents the wavelength of incident light, and the vertical axis represents external quantum efficiency. In FIG. 4, a solid line represents a measurement result in the structure of the present embodiment in which the first electrode 10 is formed of a stacked film of aluminum and titanium, and a broken line represents a measurement result in the structure of the comparative example in which the first electrode 10 is formed of only titanium.

As illustrated in FIG. 5, by applying the electrode structure of the present embodiment (solid line), the external quantum efficiency could be improved by about 30% as compared with the electrode structure of the comparative example (dashed line).

As described above, according to the present embodiment, it is possible to suppress an increase in contact resistance between the first electrode 10 and the photoelectric conversion film 20 while effectively using the reflected light of the first metal layer 12, and it is possible to realize a light detecting element with high light utilization efficiency.

Second Embodiment

A photoelectric conversion device and a method of manufacturing the same according to a second embodiment of the present invention will be described with reference to FIG. 6 to FIG. 8F.

In the present embodiment, a photoelectric conversion device will be described as an example of a semiconductor device to which the light detecting element according to the first embodiment is applied. The photoelectric conversion device may include not only a device such as an imaging device for the purpose of acquiring an image, but also a device such as a focus detection device for the purpose of not mainly acquiring an image.

Figure 6:
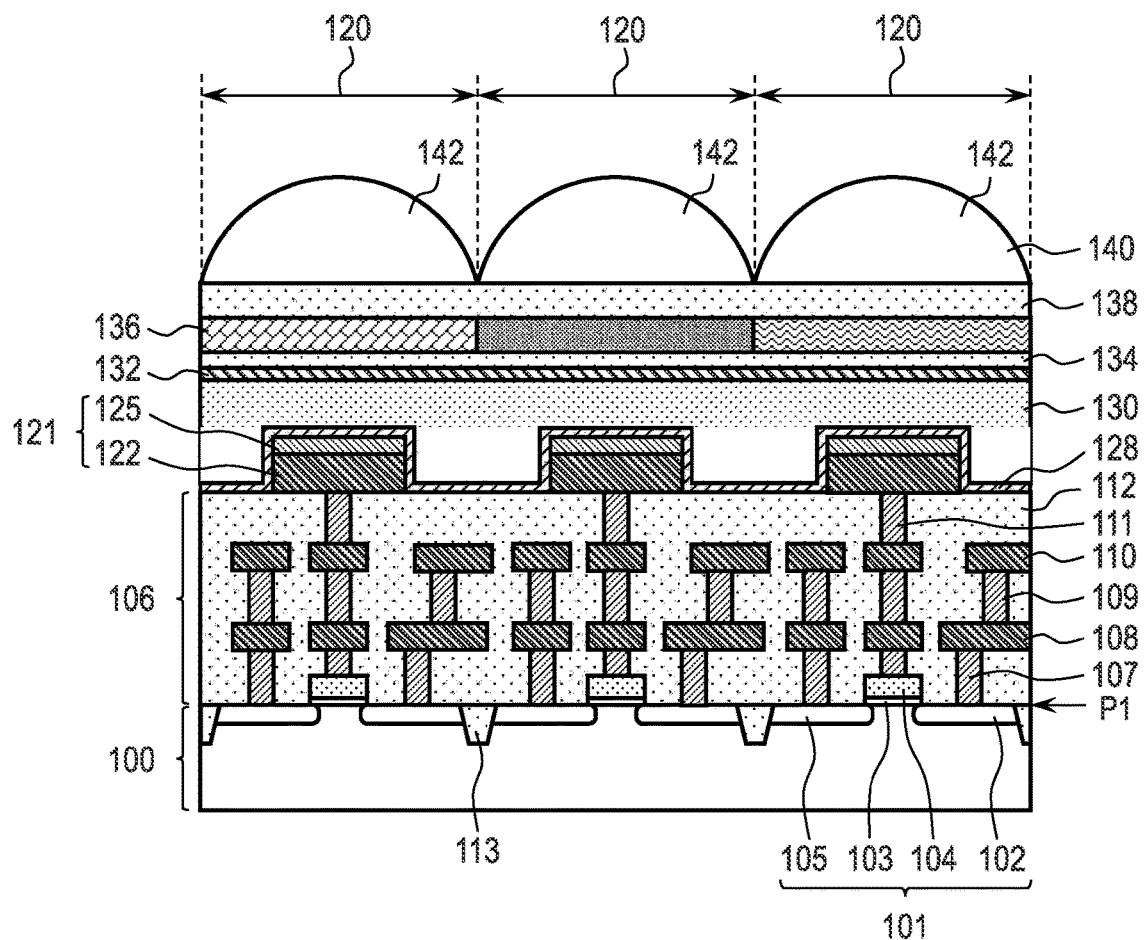
FIG. 6 is a schematic cross-sectional view illustrating a configuration example of a photoelectric conversion device according to a second embodiment of the present invention.
Figure 7:
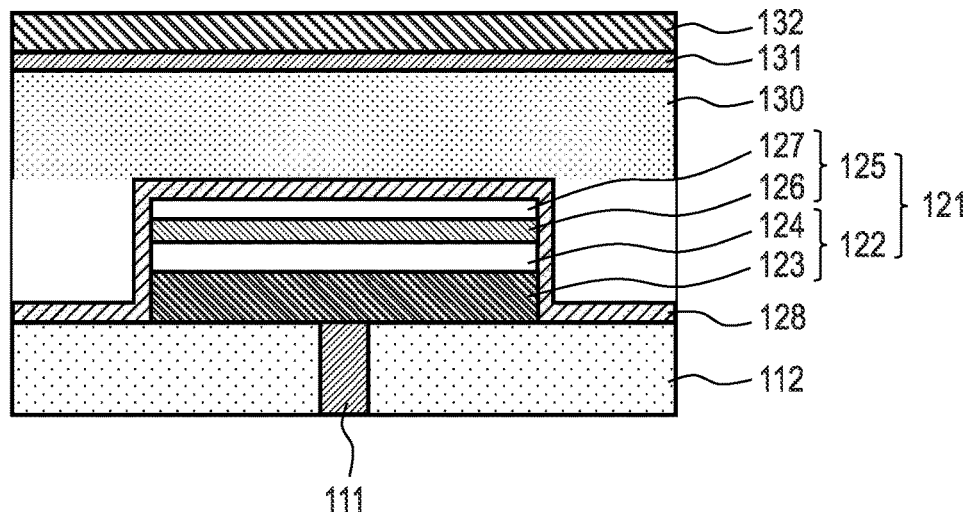
FIG. 7 is a schematic cross-sectional view illustrating a light detecting element in the photoelectric conversion device according to the second embodiment of the present invention.

First, the structure of the photoelectric conversion device according to the present embodiment will be described with reference to FIG. 6 and FIG. 7. FIG. 6 is a schematic cross-sectional view illustrating a configuration example of the photoelectric conversion device according to the present embodiment. FIG. 7 is a schematic cross-sectional view illustrating a specific structure of the light detecting element in the photoelectric conversion device according to the present embodiment.

The photoelectric conversion device according to the present embodiment includes a substrate 100. The substrate 100 has a main surface P1. In the present embodiment, a semiconductor substrate such as a silicon single crystalline substrate is assumed as the substrate 100. However, the substrate 100 is not necessarily a semiconductor substrate, and may be an insulating substrate such as glass or ceramic in which a semiconductor layer is provided on a surface portion thereof. The substrate 100 may function as a support substrate for supporting the light detecting element or the like.

A transistor 101 and an element isolation portion 113 are provided in the vicinity of the main surface P1 of the substrate 100. The transistor 101 is, for example, an n-channel MOS transistor, and includes n-type semiconductor regions 102 and 105 constituting source/drain regions, a gate insulating film 103, and a gate electrode 104. The n-type semiconductor regions 102 and 105 are provided in the substrate 100. The gate electrode 104 is provided over the main surface P1 between the n-type semiconductor region 102 and the n-type semiconductor region 105 with the gate insulating film 103 interposed therebetween. The element isolation portion 113 is an insulating structure provided inside the substrate 100, and may be configured by an STI (Shallow Trench Isolation) structure, for example.

An interconnection structure 106 is provided over the main surface P1 of the substrate 100. The interconnection structure 106 includes a plurality of interconnection layers provided in the insulating layer 112. FIG. 6 illustrates a multi-level interconnection structure including a first interconnection layer including an interconnection 108 and a second interconnection layer including an interconnection 110. However, the multi-level interconnection structure constituting the interconnection structure 106 does not necessarily have to be two layers, and may be one layer or three or more layers. The interconnection structure 106 includes a contact plug 107 connecting the transistor 101 and the interconnection 108, a via plug 109 connecting the interconnection 108 and the interconnection 110, and a via plug 111 connected to the interconnection 110. In this specification, the substrate 100 and the interconnection structure 106 may be referred to as a "substrate" inclusively.

These members constituting the interconnection structure 106 may be formed using materials or manufacturing processes generally used in semiconductor devices. For example, the contact plugs 107 and the via plugs 109 and 111 may be formed of one or more conductive materials selected from aluminum, copper, tungsten, titanium, and titanium nitride. Typically, the contact plugs 107 and the via plugs 109, 111 may have a stacked structure of titanium, titanium nitride, and tungsten. The interconnections 108 and 110 may be formed of one or more conductive materials selected from aluminum, copper, tungsten, titanium, titanium nitride, tantalum, and the like. Typically, the interconnections 108, 110 may be a stacked structure of tantalum and copper. The insulating layer 112 may be formed of, for example, an insulating material selected from silicon oxide, silicon nitride, aluminum oxide, and the like. Although not illustrated in detail in FIG. 2 and FIG. 3, the insulating layer 112 is generally formed of a multilayer film formed of a plurality of kinds of insulating materials.

A plurality of lower electrode structures 121 is provided over the interconnection structure 106. Each of the lower electrode structures 121 includes a lower electrode 122 and a metal compound layer 125 provided over the lower electrode 122. Each of the lower electrodes 122 is connected to the via plug 111. An intermediate layer 128 is provided over the interconnection structure 106 including the upper and side surfaces of the lower electrode structure 121. A photoelectric conversion film 130 is provided over the intermediate layer 128. An upper electrode 132 is provided over the photoelectric conversion film 130.

An insulating layer 134 is provided over the upper electrode 132. The insulating layer 134 may function as a protection layer or a sealing layer. A color filter layer 136 is provided over the insulating layer 134. The color filter layer 136 includes color filters of a plurality of colors. A planarization layer 138 having a flat top surface is provided over the color filter layer 136. A microlens layer 140 including a plurality of microlenses 142 is provided over the planarization layer 138.

One unit cell 120 may include one microlens 142, one color filter, at least one light detecting element, and a readout circuit provided in the substrate 100 and the interconnection structure 106. One light detecting element includes the lower electrode 122, the photoelectric conversion film 130, and the upper electrode 132. The lower electrode 122 is an individual electrode provided for each light detecting element, and corresponds to the first electrode 10 in the light detecting element according to the first embodiment. The upper electrode 132 is a common electrode which is also used by a plurality of light detecting elements, and corresponds to the second electrode 30 in the light detecting element according to the first embodiment. The transistors 101 provided on the substrate 100, together with the interconnection structure 106, constitute the readout circuit for reading out a signal output from the light detecting element. Although FIG. 6 illustrates a configuration example in which one unit cell 120 includes one light detecting element, the number of light detecting elements included in one unit cell 120 is not particularly limited. The unit cell 120 may be referred to as a pixel or a sub-pixel.

Next, the light detecting element in the photoelectric conversion device according to the present embodiment will be described in more detail with reference to FIG. 7.

As illustrated in FIG. 7, the light detecting element of the photoelectric conversion device according to the present embodiment includes a lower electrode 122, a metal compound layer 125, an intermediate layer 128, a photoelectric conversion film 130, a metal compound layer 131, and an upper electrode 132. The lower electrode 122 and the metal compound layer 125 constitute an independent lower electrode structure 121 for each light detecting element. The intermediate layer 128 is provided over the insulating layer 112 (interconnection structure 106) including the upper surface and the side surface of the lower electrode structure 121. The photoelectric conversion film 130 is provided over the intermediate layer 128. The metal compound layer 131 is provided over the photoelectric conversion film 130. The upper electrode 132 is provided over the metal compound layer 131.

The lower electrode 122 corresponds to the first electrode 10 in the light detecting element according to the first embodiment, and includes a first metal layer 123 and a second metal layer 124 provided over the first metal layer 123. The first metal layer 123 corresponds to the first metal layer 12 in the light detecting element according to the first embodiment, and has a function of reflecting light incident from above the upper electrode 132 and a function of collecting electrons generated in the photoelectric conversion film 130. The first metal layer 123 preferably has a structure that does not diffusely reflect light so that the reflected light does not affect the adjacent light detecting elements. For example, the surface of the first metal layer 123 is preferably flat or concave shape. The second metal layer 124 corresponds to the second metal layer 14 in the light detecting element according to the first embodiment, and may have a function of protecting the first metal layer 123. The metal materials constituting the first metal layer 123 and the second metal layer 124 are the same as those of the first metal layer 12 and the second metal layer 14 in the light detecting element according to the first embodiment.

The metal compound layer 125 corresponds to the metal compound layer 16 in the light detecting element according to the first embodiment. The metal compound layer 125 may include a metal oxide layer 126 and a carrier injection blocking layer 127 provided over the metal oxide layer 126. The metal oxide layer 126 is formed of an oxide of a metal material constituting the second metal layer 124. The metal oxide layer 126 and the carrier injection blocking layer 127 may function as a layer that blocks holes and conducts electrons (hole blocking layer). The materials constituting the metal oxide layer 126 and the carrier injection blocking layer 127 are the same as those of the metal compound layer 16 in the light detecting element according to the first embodiment.

The intermediate layer 128 corresponds to the intermediate layer 18 in the light detecting element according to the first embodiment, and has a role of suppressing peeling of the photoelectric conversion film 130 caused by poor wettability between the metal compound layer 125 and the photoelectric conversion film 130 and between the insulating layer 112 and the photoelectric conversion film 130. For this purpose, the intermediate layer 128 is preferably provided over the entire surface so as to increase the contact area between the intermediate layer 128 and the photoelectric conversion film 130. The material of the intermediate layer 128 is the same as that of the intermediate layer 18 in the light detecting element according to the first embodiment. Since the intermediate layer 128 is inserted between the metal compound layer 125 and the photoelectric conversion film 130, the intermediate layer 128 is preferably formed of a material having little influence on the contact resistance between the metal compound layer 125 and the photoelectric conversion film 130. From such a viewpoint, the intermediate layer 128 is preferably formed of the same material as the constituent material of the metal compound layer 125 to reduce the contact resistance to the metal compound layer 125 and also to be used as a hole blocking layer.

The intermediate layer 128 may control the movement of charges in the direction in which the electric field is applied (the thickness direction of the intermediate layer 128), but may not control the movement of charges in the direction intersecting the direction in which the electric field is applied (the plane direction of the intermediate layer 128). Therefore, when the conductivity of the material constituting the intermediate layer 128 is high, leakage current or crosstalk may occur between the unit cells 120 through the intermediate layer 128. In such a case, the intermediate layer 128 may be formed of an aggregate of island-like structures having a size of, for example, about several nm$^2$, instead of a film.

The photoelectric conversion film 130 corresponds to the photoelectric conversion film 20 in the light detecting element according to the first embodiment. The photoelectric conversion film 130 is formed of a photoelectric conversion material, and generates charges corresponding to the amount of light incident through the microlens 142, the color filter, and the upper electrode 132, and the amount of light reflected by the lower electrode 122 and incident again after passing through the photoelectric conversion film 130. The material of the photoelectric conversion film 130 is the same as that of the photoelectric conversion film 20 in the light detecting element according to the first embodiment.

The metal compound layer 131 corresponds to the metal compound layer 32 in the light detecting element according to the first embodiment. The metal compound layer 131 may function as a layer that blocks electrons and conducts holes (electron blocking layer). The material of the metal compound layer 131 is the same as that of the metal compound layer 32 in the light detecting element according to the first embodiment.

The upper electrode 132 corresponds to the second electrode 30 in the light detecting element according to the first embodiment. The material of the upper electrode 132 is the same as that of the second electrode 30 in the light detecting element according to the first embodiment.

In order to effectively use incident light in the light detecting element, the first metal layer 123 of the lower electrode 122 needs to have a high reflectance in a wavelength band of light in which the photoelectric conversion film 130 has optical sensitivity. Examples of the material having high reflectance with respect to visible light include aluminum and silver. However, a material having high reflectance such as aluminum is easily oxidized in the manufacturing process, and an oxide layer having high electric resistivity is formed on the surface. For example, in the present embodiment, the carrier injection blocking layer 127 is disposed between the lower electrode 122 and the photoelectric conversion film 130, but the constituent material of the carrier injection blocking layer 127 is typically an oxide material. Therefore, if the carrier injection blocking layer 127 is formed directly on the first metal layer 123, an oxide layer having high electric resistance is formed between the lower electrode 122 and the photoelectric conversion film 130, and the collection of electrons by the lower electrode 122 is hindered.

From this viewpoint, in the present embodiment, the lower electrode 122 is formed of the first metal layer 123 and the second metal layer 124. Of the first metal layer 123 and the second metal layer 124 constituting the lower electrode 122, the first metal layer 123 mainly functions as a reflection film. Therefore, the first metal layer 123 may be selected from metal materials having high reflectance of light corresponding to the absorption wavelength band of the photoelectric conversion film 130. For example, when visible light is detected by the light detecting element, aluminum (Al), silver (Ag), an alloy thereof, or the like may be applied as a constituent material of the first metal layer 123.

The second metal layer 124 has a function of protecting the first metal layer 123, specifically, functions as an oxidation prevention layer for preventing the first metal layer 123 from being oxidized in the process of forming the carrier injection blocking layer 127. By arranging the second metal layer 124 between the first metal layer 123 and the carrier injection blocking layer 127, it is possible to prevent the first metal layer 123 from being oxidized to form a layer having high electric resistivity between the first metal layer 123 and the carrier injection blocking layer 127.

The second metal layer 124 may be oxidized by forming the carrier injection blocking layer 127 on the second metal layer 124. Therefore, the material constituting the second metal layer 124 is selected from materials in which the oxide has electric characteristics equivalent to those of the carrier injection blocking layer 127, that is, metal materials that may function as a hole blocking layer that blocks holes and conducts electrons only. Examples of the metal material in which the oxide may function as a hole blocking layer include titanium, tantalum, zirconium, and the like. The metal oxide layer 126 constituting a part of the metal compound layer 125 is formed by oxidizing the second metal layer 124.

Although the second metal layer 124 needs to have a film thickness sufficient to suppress oxidation of the first metal layer 123, if the second metal layer 124 is too thick, light reaching the first metal layer 123 decreases, and reflection of light from the first metal layer 123 cannot be effectively utilized. From this viewpoint, the film thickness of the second metal layer 124 is preferably as thin as possible within a range in which oxidation of the first metal layer 123 may be suppressed. That is, as described in the first embodiment, the film thickness of the second metal layer 14 is preferably set in the range of 5 nm to 50 nm, more preferably in the range of 10 nm to 20 nm.

By configuring the second metal layer 124 in this manner, it is possible to suppress an increase in contact resistance between the lower electrode 122 and the photoelectric conversion film 130 while effectively using the reflected light of the first metal layer 123.

Next, a method of manufacturing the photoelectric conversion device according to the present embodiment will be described with reference to FIG. 8A to FIG. 8F. FIG. 8A to FIG. 8F are cross-sectional views illustrating a method of manufacturing the photoelectric conversion device according to the present embodiment.

First, predetermined elements such as the transistor 101 and the element isolation portion 113 are formed on the main surface P1 of the substrate 100, which is, for example, a silicon substrate, by using a general semiconductor process. The transistor 101 is, for example, an n-channel MOS transistor, and includes n-type semiconductor regions 102 and 105, a gate insulating film 103, and a gate electrode 104. The element isolation portion 113 has, for example, an STI (Shallow Trench Isolation) structure.

Figure 8A:
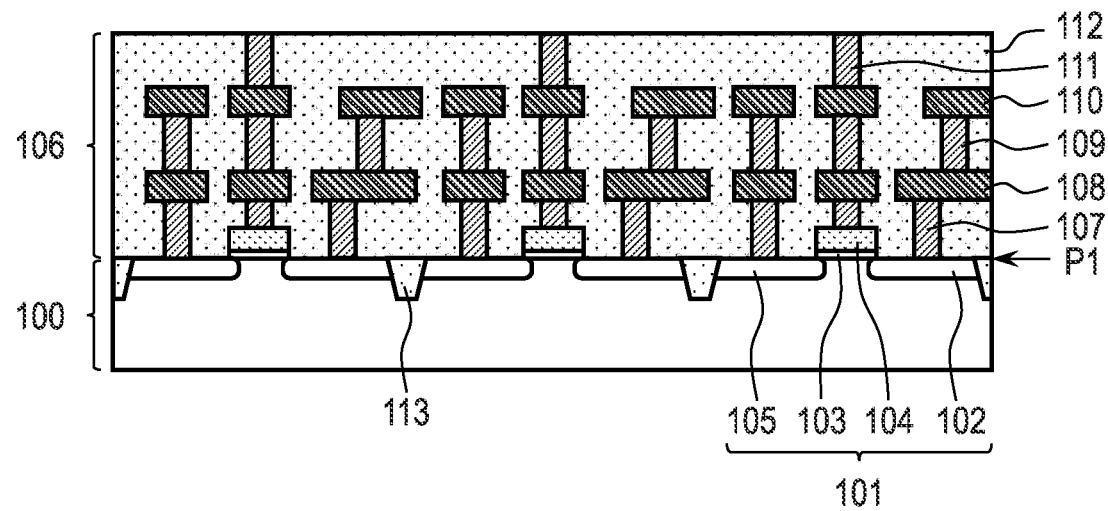
FIG. 8A, FIG. 8B, FIG. 8C, FIG. 8D, FIG. 8E and FIG. 8F are cross-sectional views illustrating a method of manufacturing the photoelectric conversion device according to the second embodiment of the present invention.

Next, an interconnection structure 106 having a plurality of interconnection layers in the insulating layer 112 is formed over the main surface P1 of the substrate 100 provided with the transistor 101, the element isolation portion 113, and the like by a general semiconductor process (FIG. 8A). FIG. 8A illustrates an interconnection structure 106 including a first interconnection layer including an interconnection 108 and a second interconnection layer including an interconnection 110. The interconnection structure 106 further includes a contact plug 107 connecting the transistor 101 and the interconnection 108, a via plug 109 connecting the interconnection 108 and the interconnection 110, and a via plug 111 connected to the interconnection 110.

These members constituting the interconnection structure 106 may be formed using materials or manufacturing processes generally used in semiconductor devices. For example, the contact plugs 107 and the via plugs 109 and 111 may be formed of one or more conductive materials selected from aluminum, copper, tungsten, titanium, and titanium nitride. Typically, the contact plugs 107 and the via plugs 109, 111 may have a stacked structure of titanium, titanium nitride, and tungsten. The interconnections 108 and 110 may be formed of one or more conductive materials selected from aluminum, copper, tungsten, titanium, titanium nitride, tantalum, and the like. Typically, the interconnections 108, 110 may have a stacked structure of tantalum and copper. The insulating layer 112 may be formed of an insulating material such as silicon oxide or silicon nitride. Although not illustrated in detail in FIG. 8A, the insulating layer 112 is generally formed of a multilayer film formed of a plurality of kinds of insulating materials.

Next, an aluminum film 123a of, e.g., a 200 nm-thickness and a titanium film 124a of, e.g., a 10 nm-thickness are sequentially deposited over the interconnection structure 106 by, e.g., sputtering method. The aluminum film 123a is a film to be the first metal layer 123 of the lower electrode 122, and the titanium film 124a is a film to be the second metal layer 124 of the lower electrode 122.

Next, a titanium oxide film 127a of, e.g., a 50 nm-thickness is deposited over the titanium film 124a by, e.g., sputtering method. The titanium oxide film 127a is a film to be the carrier injection blocking layer 127. Generally, a $TiO_2$ target or a Ti target is used as a target and a reactive sputtering method using argon and oxygen as a sputtering gas is used for forming a titanium oxide film by a sputtering method. For example, the deposition may be performed using a $TiO_2$ target as a target and using an argon gas mixed with oxygen at a ratio of 5% as a sputtering gas under the conditions of an RF power of 500 W and a chamber pressure of 0.5 Pa.

When titanium oxide is formed, if oxygen is not mixed into a sputtering gas, the deposited titanium oxide film has a low oxidation degree including many oxygen defects in the film. Here, when titanium oxide is expressed as $TiO_x$, the larger the composition x of oxygen, the higher the degree of oxidation. The stoichiometric composition of titanium oxide is $TiO_2$, and titanium oxide having a low oxidation degree contains a low valence TiO component.

The Fermi level of titanium oxide may be controlled by the degree of oxidation. For example, the Fermi level in the case where oxygen is not mixed into a sputtering gas is approximately −4.5 eV, whereas the Fermi level in the case where a sputtering gas in which oxygen is mixed into argon at a ratio of 20% is used is approximately −4.8 eV. As the Fermi level changes, the conductivity also changes from low resistance to high resistance. For example, when oxygen is not mixed into a sputtering gas, the specific resistance is about $8\times10^2$ Ω-cm, whereas when a sputtering gas in which oxygen is mixed in argon at a ratio of 5% is used, the specific resistance is about $1\times10^{13}$ Ω-cm. When a sputtering gas in which oxygen is mixed in argon at a ratio of 10% is used, the specific resistance of titanium oxide is about $3\times10^{13}$ Ω-cm.

Figure 8B:
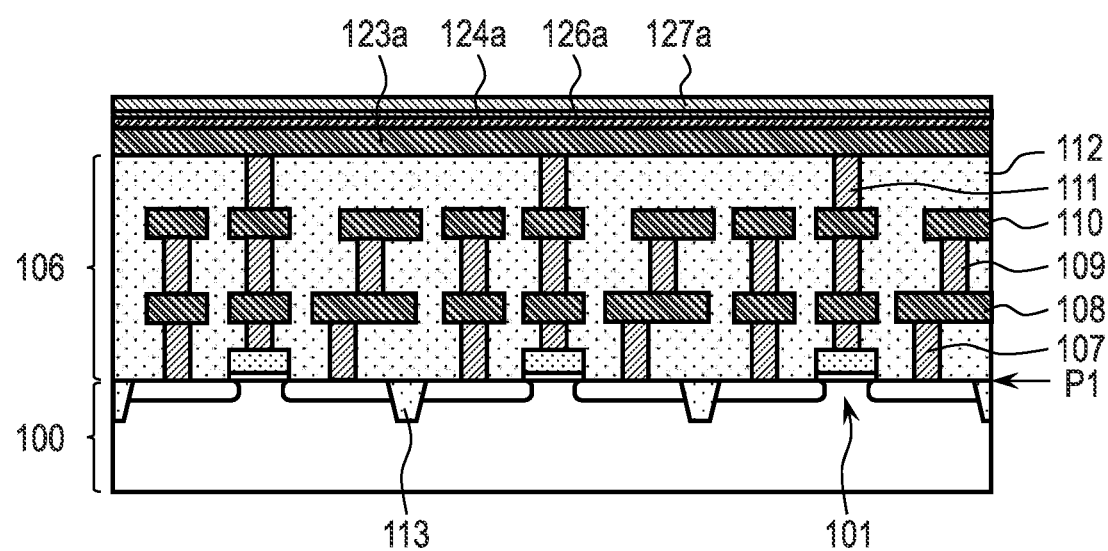

When the titanium oxide film 127a is formed on the titanium film 124a under such conditions, the surface of the titanium film 124a is oxidized by about several nm. The titanium oxide film 126a thus formed becomes the metal oxide layer 126 (FIG. 8B).

Figure 8C:
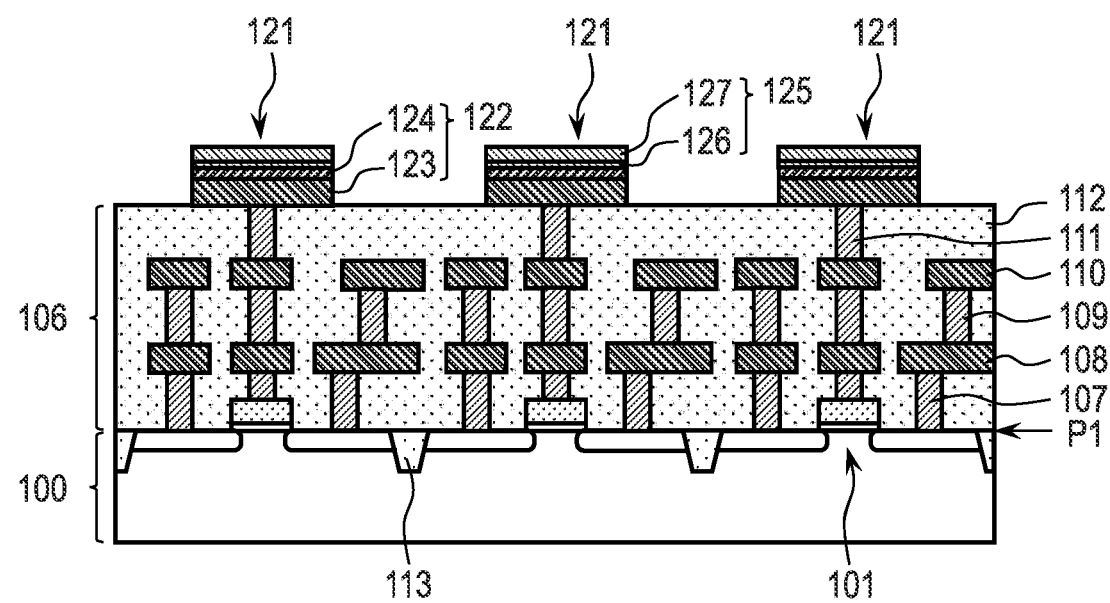

Next, the aluminum film 123a, the titanium film 124a, and the titanium oxide films 126a and 127a are patterned by photolithography and dry etching to form a plurality of lower electrode structures 121. Each lower electrode structure 121 includes a lower electrode 122 and a metal compound layer 125 provided on the lower electrode 122. The lower electrode 122 includes a first metal layer 123 formed of an aluminum film 123a and a second metal layer 124 formed of a titanium film 124a. The metal compound layer 125 includes a metal oxide layer 126 formed of a titanium oxide film 126a and a carrier injection blocking layer 127 formed of a titanium oxide film 127a (FIG. 8C).

Figure 8D:
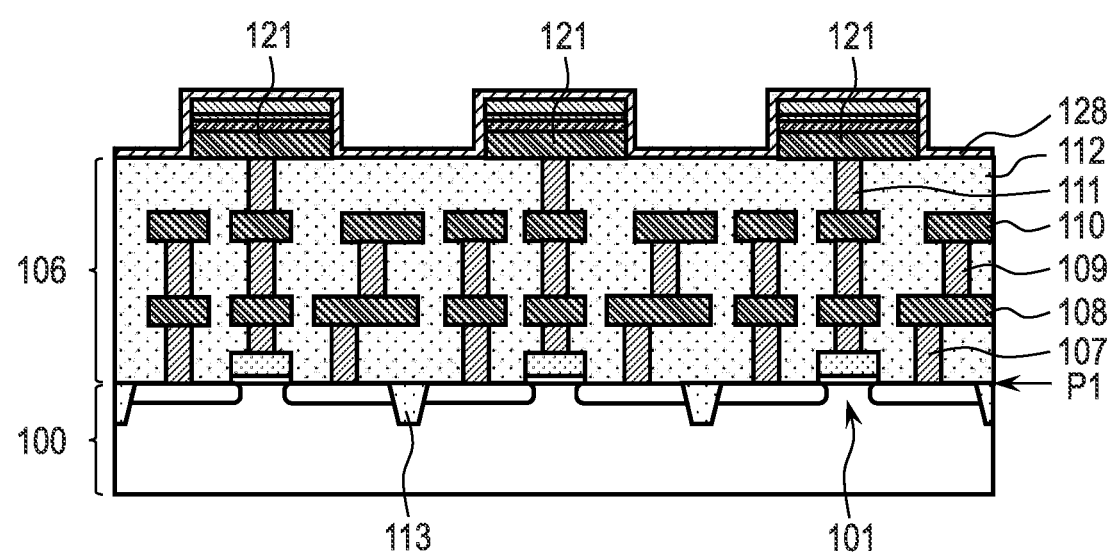

Next, titanium oxide is deposited to a thickness of, for example, about 1 nm to 100 nm over the entire surface of the interconnection structure 106 including the upper surface and the side surface of the lower electrode structure 121 by, for example, an evaporation method or a sputtering method to form an intermediate layer 128 formed of titanium oxide (FIG. 8D). When the intermediate layer 128 is formed of titanium oxide, film formation conditions similar to those of the titanium oxide film 127a may be applied.

When the intermediate layer 128 is formed, by making the set film thickness thin (for example, about 1 nm in terms of film formation rate), it is also possible to form the intermediate layer 128 formed of an island-like structure aggregate having a size of, for example, about several $nm^2$, instead of a film shape. By configuring the intermediate layer 128 in this manner, leakage current and crosstalk between the unit cells 120 via the intermediate layer 128 may be suppressed.

Next, the photoelectric conversion film 130 is formed over the intermediate layer 128. The photoelectric conversion film 130 is not particularly limited, but here, the photoelectric conversion film 130 including quantum dots formed of nanoparticles of lead sulfide (PbS), which is a compound semiconductor, is formed.

First, a quantum dot coating solution containing nanoparticles of PbS is applied onto the intermediate layer 128 by spin coating method. The coating film thus formed is referred to herein as a provisional quantum dot film. The provisional quantum dot film after spin-coating is an aggregate of quantum dots protected by ligands (for example, oleic acid) having a long molecular length, so that the space between the quantum dots is large. That is, the conductivity of photocarriers generated by light irradiation is poor, and photoelectric conversion performance is extremely low. Therefore, ligand exchange is performed on the provisional quantum dot film by replacing a ligand having a long molecular length with a ligand having a short molecular length (for example, benzenedithiol or methylbenzoic acid). Ligand exchange is carried out by applying a solution containing a ligand having a short molecular length (ligand solution) onto the provisional quantum dot film. Specifically, ligand exchange is carried out by applying a ligand solution onto the provisional quantum dot film and conducting a ligand exchange reaction for a predetermined time. After a predetermined reaction time has elapsed, the substrate is rotated to shake off the liquid and dry the liquid. After the ligand exchange, rinsing is performed in order to remove excessive ligands remaining in the film and ligands desorbed from the provisional quantum dot film. The thickness of the quantum dot film after the ligand exchange is 40 nm to 60 nm.

A quantum dot film having a desired film thickness is formed by repeating the above-described formation of the provisional quantum dot film, ligand exchange, and rinsing. For example, by repeating a series of processes seven times, the photoelectric conversion film 130 having a thickness of about 280 nm to 420 nm including seven quantum dot films may be formed.

Next, molybdenum oxide is deposited over the photoelectric conversion film 130 by, for example, a vacuum evaporation method to form a metal compound layer 131 formed of molybdenum oxide.

Figure 8E:
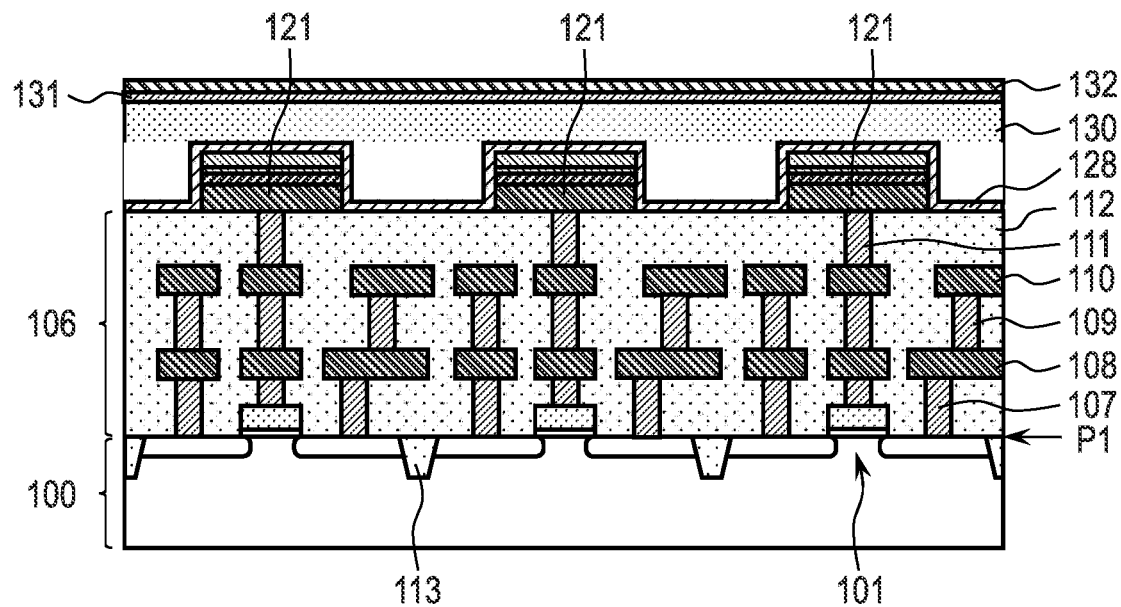

Next, indium tin oxide (ITO) is deposited over the metal compound layer 131 by, e.g., sputtering method to form an upper electrode 132 formed of ITO (FIG. 8E).

Figure 8F:
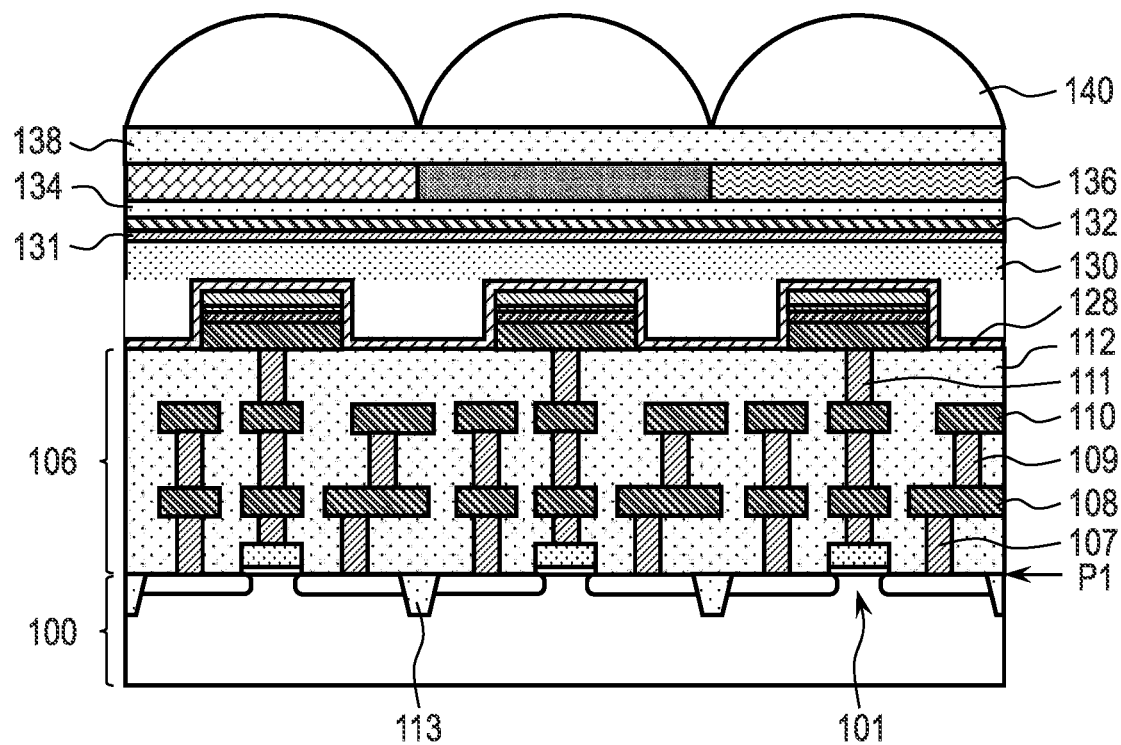

Next, the insulating layer 134, the color filter layer 136, the planarization layer 138, the microlens layer 140, and the like are sequentially formed over the upper electrode 132 in the same manner as in a general method of manufacturing a semiconductor device (FIG. 8F). Thus, the photoelectric conversion device according to the present embodiment is completed.

As described above, according to the present embodiment, it is possible to realize a highly sensitive photoelectric conversion device including a light detecting element with high light utilization efficiency.

Third Embodiment

Figure 9A:
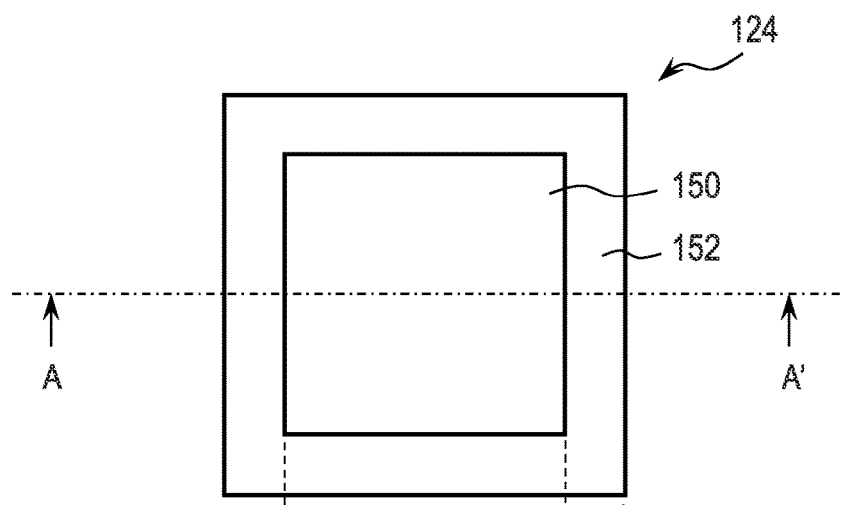
FIG. 9A is a plan view illustrating a light detecting element in a photoelectric conversion device according to a third embodiment of the present invention.
Figure 9B:
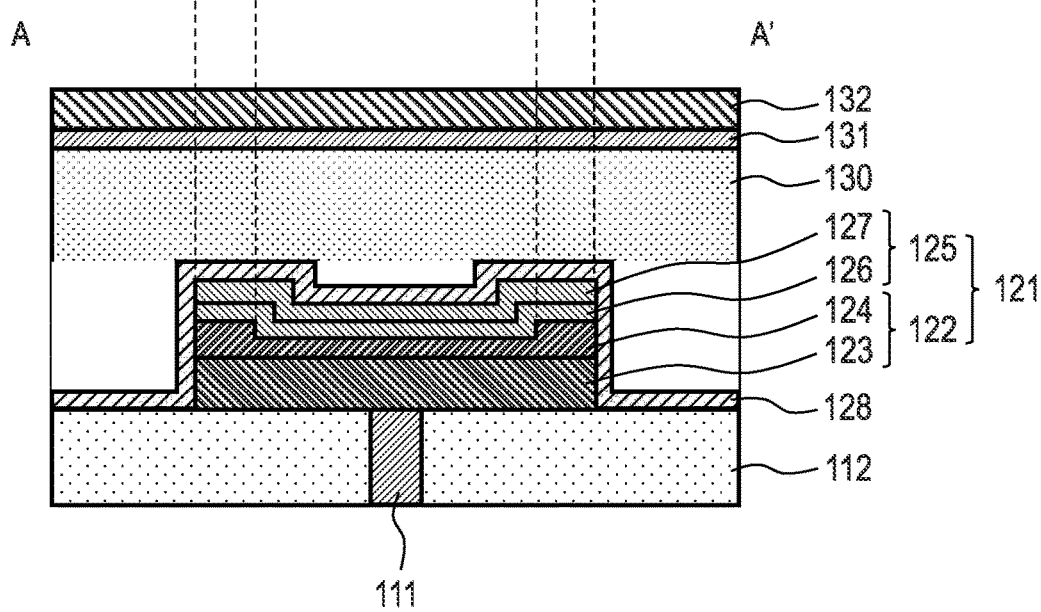
FIG. 9B is a schematic cross-sectional view illustrating the light detecting element in the photoelectric conversion device according to the third embodiment of the present invention.

A photoelectric conversion device according to a third embodiment of the present invention will be described with reference to FIG. 9A and FIG. 9B. FIG. 9A is a plan view illustrating the structure of a light detecting element of a photoelectric conversion device according to the present embodiment. FIG. 9B is a schematic cross-sectional view illustrating the structure of the light detecting element of the photoelectric conversion device according to the present embodiment. The same components as those in the second embodiment are denoted by the same reference numerals, and the description thereof will be omitted or simplified.

The photoelectric conversion device according to the present embodiment is similar to the photoelectric conversion device according to the second embodiment except that the structure of the light detecting element is different. That is, in the light detecting element of the photoelectric conversion device according to the present embodiment, as illustrated in FIG. 9A and FIG. 9B, the second metal layer 124 has the first region 150 and the second region 152 having a thickness thicker than that of the first region 150. The thickness of the first region 150 is not less than 5 nm and not more than 50 nm, preferably not less than 10 nm and not more than 20 nm. The thickness of the second region 152 is thicker than 50 nm, for example, about 60 nm. The second region 152 is arranged around the first region 150, for example, so as to surround the first region 150 in a plan view. Note that a plan view in this specification represents a state in which each component of the photoelectric conversion device is projected onto a plane parallel to the surface of the substrate 100, and corresponds to the planar layout diagram of FIG. 9A.

Although the reflectance of the lower electrode 122 is preferably high from the viewpoint of effectively using incident light, for example, when a plurality of light detecting elements are arranged adjacent to each other as illustrated in FIG. 6, light reflected by the lower electrode 122 may be incident on the adjacent unit cell 120. This light generates an electron-hole pair in the photoelectric conversion film 130, and when the electron-hole pair is collected by the lower electrode 122 and the upper electrode 132 of the adjacent unit cell 120, the electron-hole pair causes crosstalk between the unit cells 120. In particular, since the incident angle of the light incident on the peripheral portion of the lower electrode 122 with respect to the lower electrode 122 becomes large, there is a high possibility that the light reflected by the lower electrode 122 leaks into the adjacent unit cell 120.

Therefore, in the present embodiment, the second metal layer 124 is constituted by the first region 150 and the second region 152 having a larger film thickness than the first region 150. Here, assuming that the film thickness of the first region 150 is 10 nm and the film thickness of the second region 152 is 60 nm, as illustrated in FIG. 3, the reflectance in the first region 150 is about 80% and the reflectance in the second region 152 is about 50%.

By reducing the reflectance of the peripheral portion of the lower electrode 122 in this way, the reflectance of the light obliquely incident on the second region 152 is reduced, and the leakage light to the adjacent unit cell 120 may be reduced. Thus, crosstalk between the unit cells 120 may be reduced. Since the incident angle of the light incident near the center of the lower electrode 122 to the lower electrode 122 is small and the influence on the adjacent unit cell 120 is small, the first region 150 having a high reflectance is preferably disposed at the center of the lower electrode 122.

The second metal layer 124 of the light detecting element of the present embodiment is not particularly limited, but may be formed by, for example, the following method.

In the first method, a titanium film 124a having a thickness of, for example, 60 nm is deposited over the aluminum film 123a to be the first metal layer 123, and then the titanium film 124*a* of the first region 150 is thinned to a thickness of 10 nm to 20 nm by photolithography and dry etching.

The second method is to deposit the titanium film 124*a* twice. First, a titanium film having a thickness of, for example, 40 nm to 50 nm is formed over the aluminum film 123*a* to be the first metal layer 123. Next, the titanium film in the second region 152 is removed by photolithography and dry etching. Next, a titanium film having a thickness of, for example, 10 nm to 20 nm is deposited over the entire surface.

Thereafter, by patterning the titanium film 124*a* in the step of FIG. 8C, the second metal layer 124 having the first region 150 having a thickness of about 10 to 20 nm and the second region 152 having a thickness of about 60 nm may be formed.

As described above, according to the present embodiment, it is possible to realize a highly sensitive photoelectric conversion device including a light detecting element with high light utilization efficiency. In addition, by devising the electrode structure of the light detecting element, crosstalk between adjacent unit cells may be suppressed.

Fourth Embodiment

Figure 10A:
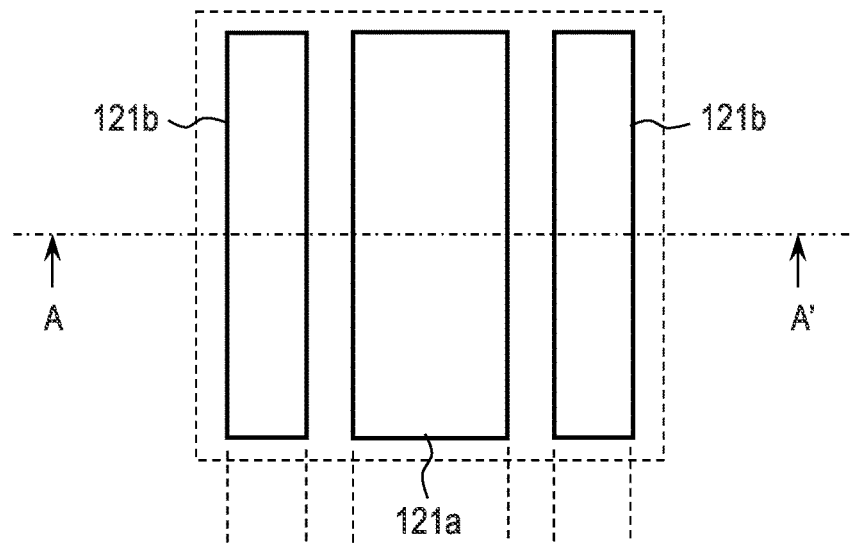
FIG. 10A is a plan view illustrating a light detecting element in a photoelectric conversion device according to a fourth embodiment of the present invention.
Figure 10B:
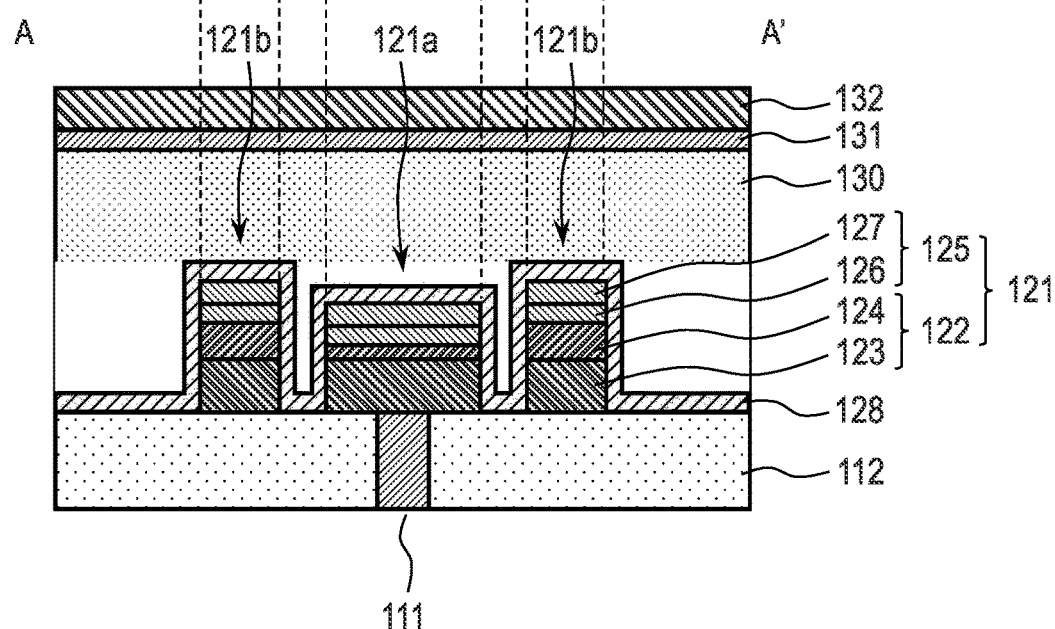
FIG. 10B is a schematic cross-sectional view illustrating the light detecting element in the photoelectric conversion device according to the fourth embodiment of the present invention.

A photoelectric conversion device according to a fourth embodiment of the present invention will be described with reference to FIG. 10A and FIG. 10B. FIG. 10A is a schematic cross-sectional view illustrating the structure of a light detecting element of a photoelectric conversion device according to the present embodiment. FIG. 10B is a schematic cross-sectional view illustrating the structure of the light detecting element of the photoelectric conversion device according to the present embodiment. The same components as those in the second and third embodiments are denoted by the same reference numerals, and the description thereof will be omitted or simplified.

The photoelectric conversion device according to the present embodiment is similar to the photoelectric conversion device according to the second embodiment except that the structure of the light detecting element is different. That is, the light detecting element of the photoelectric conversion device according to the present embodiment has a plurality of lower electrode structures 121 as illustrated in FIGS. 10A and 10B. The plurality of lower electrode structures 121 include a lower electrode structure 121*a* in which the second metal layer 124 has a first thickness, and a lower electrode structure 121*b* in which the second metal layer 124 has a second thickness larger than the first thickness. The first film thickness corresponds to the film thickness of the first region 150 of the second metal layer 124 in the third embodiment. The second film thickness corresponds to the film thickness of the second region 152 of the second metal layer 124 in the third embodiment.

The lower electrode structure 121*b* is arranged between the lower electrode structure 121*a* and the adjacent unit cell 120. In the example of FIG. 10A and FIG. 10B, two lower electrode structures 121*b* are provided so as to sandwich the lower electrode structure 121*a*, but the number of lower electrode structures 121*b* arranged around the lower electrode structure 121*a* is not particularly limited. The arrangement of the lower electrode structures 121*b* may be appropriately determined in accordance with the relationship with the adjacent unit cells 120 (for example, arrangement interval).

The lower electrode structure 121*a* and the lower electrode structure 121*b* may or may not be electrically connected to each other. The mode in which the lower electrode structure 121*a* and the lower electrode structure 121*b* are electrically connected is not particularly limited. For example, the lower electrode structure 121*a* and the lower electrode structure 121*b* may be electrically connected to each other via the via plugs 111 and the interconnection 110.

A method of reading out a signal from the lower electrode 122 may be appropriately selected in accordance with an electrical connection state or the like of the lower electrode structures 121*a* and 121*b*. For example, signals may be read out from both the lower electrode structure 121*a* and the lower electrode structure 121*b*. Alternatively, if a signal is read out from one of the lower electrode structure 121*a* and the lower electrode structure 121*b*, the signal may not be read out from the other of the lower electrode structure 121*a* and the lower electrode structure 121*b*.

By arranging the lower electrode structure 121*b* between the lower electrode structure 121*a* and the adjacent unit cell 120, the reflectance between the lower electrode structure 121*a* and the adjacent unit cell 120 may be lowered as in the third embodiment. Thus, the leakage light to adjacent unit cells 120 may be reduced, and crosstalk between the unit cells 120 may be reduced.

The photoelectric conversion device according to the present embodiment may be formed by a manufacturing method similar to that of the photoelectric conversion device according to the third embodiment.

As described above, according to the present embodiment, it is possible to realize a highly sensitive photoelectric conversion device including a light detecting element with high light utilization efficiency. In addition, by devising the electrode structure of the light detecting element, crosstalk between adjacent unit cells can be suppressed.

Fifth Embodiment

Figure 11:
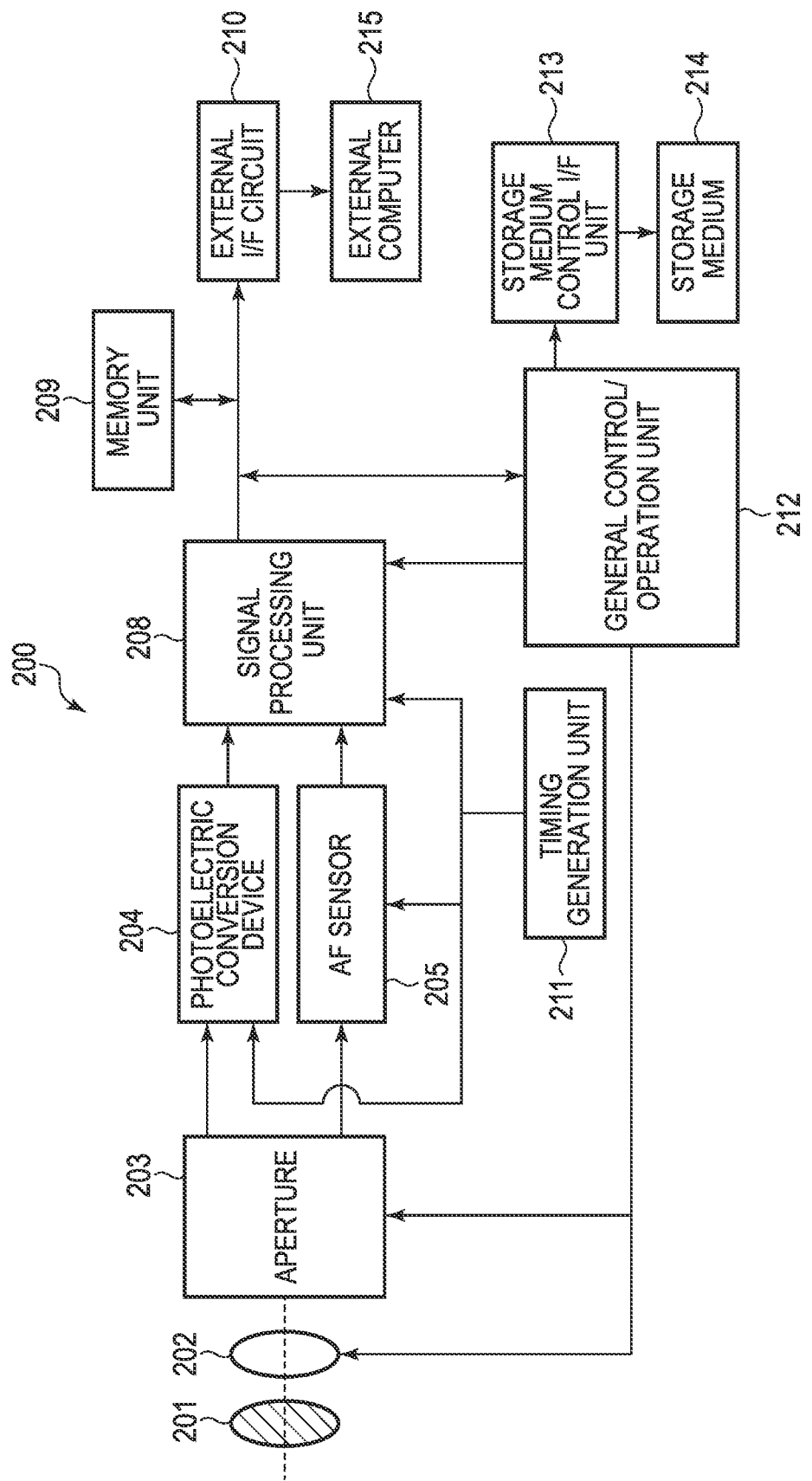
FIG. 11 is a block diagram illustrating a schematic configuration of an imaging system according to a fifth embodiment of the present invention.

An imaging system according to a fifth embodiment of the present invention will be described with reference to FIG. 11. FIG. 11 is a block diagram illustrating a schematic configuration of an imaging system according to the present embodiment.

The photoelectric conversion device described in the second to fourth embodiments is applicable to various imaging systems. Examples of apparatus to which the photoelectric conversion device may be applied include a digital still camera, a digital camcorder, a surveillance camera, a copier, a fax, a cellular phone, a smartphone, an on-vehicle camera, and an observation satellite. Further, a camera module including an optical system such as a lens and an imaging device is also included in an apparatus equipped with a photoelectric conversion device. These apparatuses may include a photoelectric conversion device and an information processing device that processes information based on a signal output from the photoelectric conversion device. FIG. 11 illustrates a block diagram of a digital still camera as an example of them.

The imaging system 200 illustrated in FIG. 11 includes a photoelectric conversion device 204, a lens 202 that forms an optical image of an object on the photoelectric conversion device 204, an aperture 203 that varies the amount of light passing through the lens 202, a barrier 201 that protects the lens 202, and an AF sensor 205. The lens 202 and the aperture 203 are optical systems that focuses light on the photoelectric conversion device 204. The photoelectric conversion device 204 is the photoelectric conversion apparatus described in any one of the second to fourth embodiments, and converts an optical image formed by the lens 202 into image data. The AF sensor 205 is for acquiring a signal necessary for focus detection.

The imaging system 200 also includes a signal processing unit 208 that processes an output signal output from the photoelectric device 204 and the AF sensor. The signal processing unit 208 generates image data from the digital signal output from the photoelectric conversion device 204. The signal processing unit 208 performs various types of correction and compression as necessary to output image data. The photoelectric conversion device 204 may include an AD conversion unit that generates a digital signal to be processed by the signal processing unit 208. The AD conversion unit may be formed on a semiconductor layer (semiconductor substrate) on which the photoelectric conversion unit of the photoelectric conversion device 204 is formed, or may be formed on a semiconductor substrate different from the semiconductor layer on which the photoelectric conversion unit of the photoelectric conversion device 204 is formed. The signal processing unit 208 may be formed on the same semiconductor substrate as the photoelectric conversion device 204.

The imaging system 200 further includes a memory unit 209 that temporarily stores image data, and an external interface unit (external I/F unit) 210 that communicates with an external computer 215 and the like. The imaging system 200 further includes a storage medium 214 such as a semiconductor memory for storing or reading out image pickup data, and a storage medium control interface unit (storage medium control I/F unit) 213 for storing or reading out image pickup data on or from the storage medium 214. The storage medium 214 may be built in the imaging system 200 or may be detachable.

The imaging system 200 further includes a general control/operation unit 212 that controls various calculations and the entire digital still camera, and a timing generation unit 211 that outputs various timing signals to the photoelectric conversion device 204, the signal processing unit 208, and the AF sensor 205. Here, the timing signal or the like may be input from the outside, and the imaging system 200 may include at least the photoelectric conversion device 204 and the signal processing unit 208 that processes the output signal output from the photoelectric conversion device 204.

The photoelectric conversion device 204 outputs an imaging signal to the signal processing unit 208. The signal processing unit 208 performs predetermined signal processing on an imaging signal output from the photoelectric conversion device 204, and outputs image data. The signal processing unit 208 generates an image using the imaging signal.

As described above, according to the present embodiment, the imaging system to which the photoelectric conversion apparatus according to the second to fourth embodiments is applied may be realized.

Sixth Embodiment

Figure 12A:
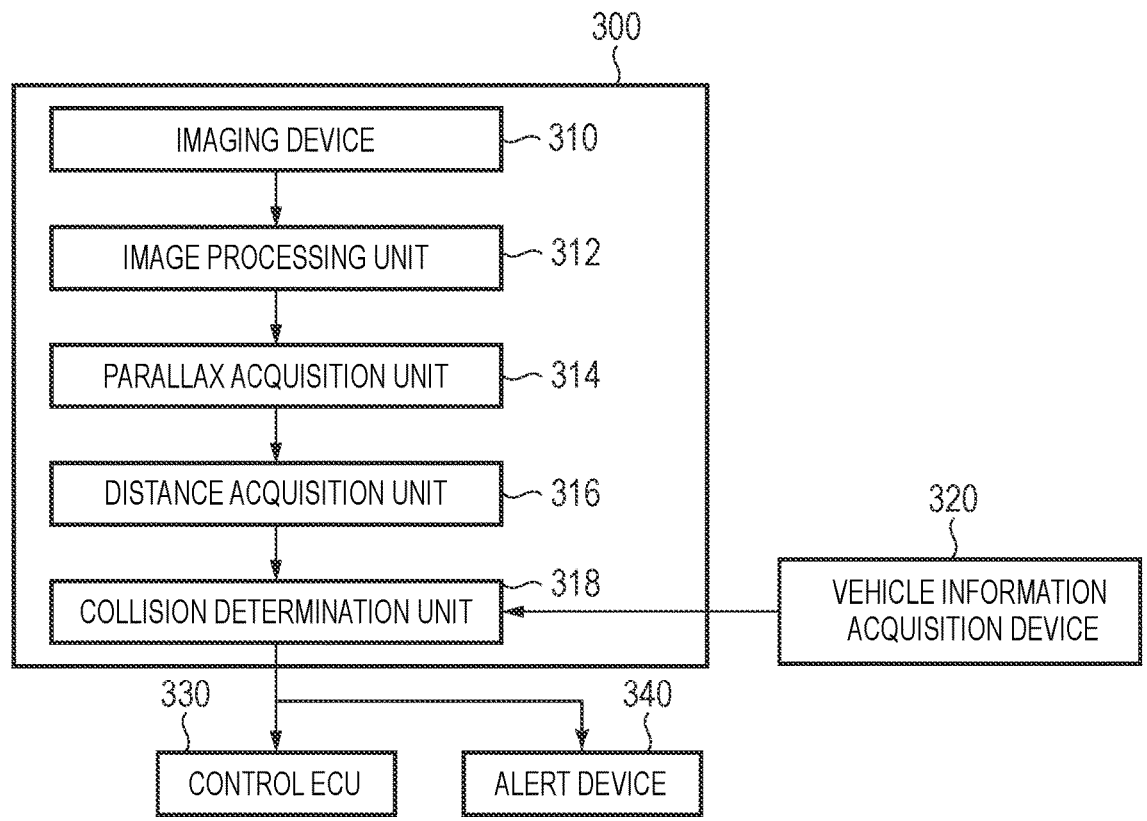
FIG. 12A is a diagram illustrating a configuration example of an imaging system according to a sixth embodiment of the present invention.
Figure 12B:
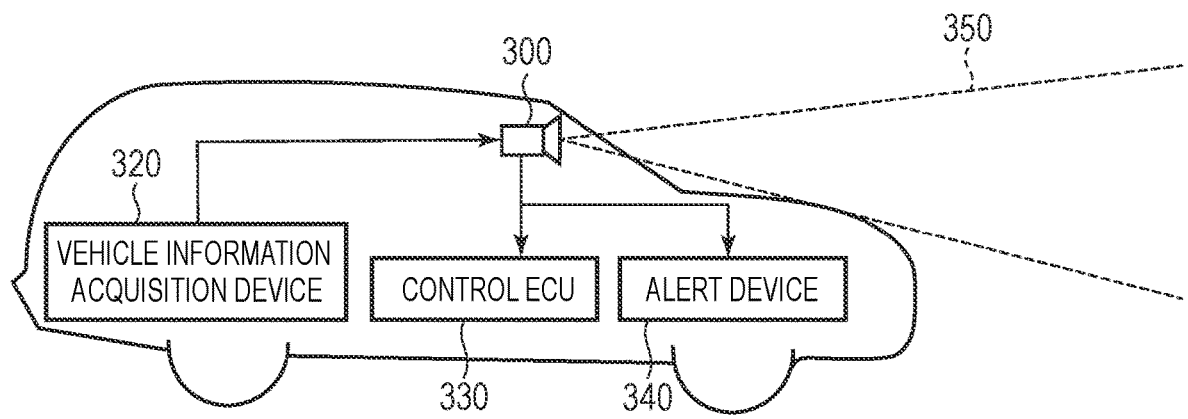
FIG. 12B is a diagram illustrating a configuration example of a transport equipment according to the sixth embodiment of the present invention.

An imaging system and a transport equipment (movable object) according to a sixth embodiment of the present invention will be described with reference to FIG. 12A and FIG. 12B. FIG. 12A is a diagram illustrating a configuration of an imaging system according to the present embodiment. FIG. 12B is a diagram illustrating a configuration of a transport equipment according to the present embodiment.

FIG. 12A illustrates an example of an imaging system related to an on-vehicle camera. The imaging system 300 includes an imaging device 310. The imaging device 310 is the photoelectric conversion device according to any one of the second to fourth embodiments. The imaging system 300 includes an image processing unit 312 that performs image processing on a plurality of image data acquired by the imaging device 310, and a parallax acquisition unit 314 that calculates parallax (phase difference of parallax images) from the plurality of image data acquired by the imaging device 310. The imaging system 300 also includes a distance acquisition unit 316 that calculates the distance to the object based on the calculated parallax, and a collision determination unit 318 that determines whether there is a possibility of collision based on the calculated distance. Here, the parallax acquisition unit 314 and the distance acquisition unit 316 are an example of a distance information acquisition unit that acquires distance information to an object. That is, the distance information is information related to parallax, defocus amount, distance to an object, and the like. The collision determination unit 318 may determine the possibility of collision using any of these distance information. The distance information acquisition unit may be realized by hardware designed exclusively, or may be realized by a software module. It may be realized by FPGA (Field Programmable Gate Array), ASIC (Application Specific Integrated circuit), or the like, or may be realized by a combination of these.

The imaging system 300 is connected to the vehicle information acquisition device 320, and may acquire vehicle information such as a vehicle speed, a yaw rate, and a steering angle. Further, the imaging system 300 is connected to a control ECU 330, which is a control device that outputs a control signal for generating braking force to the vehicle based on the determination result obtained by the collision determination unit 318. The imaging system 300 is also connected to an alert device 340 that issues an alert to the driver based on the determination result obtained by the collision determination unit 318. For example, when the collision possibility is high as the determination result of the collision determination unit 318, the control ECU 330 performs vehicle control to avoid collision and reduce damage by applying a brake, returning an accelerator, suppressing engine output, and the like. The alert device 340 alerts the user by sounding an alarm such as a sound, displaying alert information on a screen such as a car navigation system, or vibrating a seat belt or a steering.

In the present embodiment, an image of the periphery of the vehicle, for example, the front or the rear is captured by the imaging system 300. FIG. 12B illustrates an imaging system in the case of capturing an image of the front of the vehicle (imaging range 350). The vehicle information acquisition device 320 sends an instruction to the imaging system 300 or the imaging device 310. With such a configuration, the accuracy of distance measurement can be further improved.

Although an example in which the vehicle is controlled so as not to collide with another vehicle has been described above, the present invention is also applicable to a control in which the vehicle is automatically driven following another vehicle, a control in which the vehicle is automatically driven so as not to protrude from a lane, and the like. Further, the transport equipment equipped with the imaging system may be applied not only to a vehicle such as the vehicle, but also to, for example, a ship or an aircraft. The above-described embodiments may be applied not only to an electronic apparatus such as a camera or a smartphone or a transport equipment, but also to an apparatus using object recognition, such as an industrial apparatus such as an industrial robot or a machine vision, a medical apparatus such as an endoscope or a radiation diagnosis, or an office apparatus such as a multifunction peripheral. These equipment may include a light source that emits light in the absorption wavelength band of the photoelectric conversion film of the photoelectric conversion device constituting the imaging device 310. In this case, the light in the absorption wavelength band of the photoelectric conversion film of the photoelectric conversion device may be infrared light.

Modified Embodiments

The present invention is not limited to the above embodiments, and various modifications are possible.

For example, each of the embodiments illustrates one aspect of the present invention, and numerical values, shapes, materials, components, arrangements and connections of components, and the like are not intended to limit the present invention. Further, an example in which a configuration of a part of any of the embodiments is added to another embodiment or an example in which a configuration of a part of another embodiment is substituted is also an embodiment of the present invention.

Although the present invention is applied to the light detecting element in the above embodiments, the present invention may be applied to other elements other than the light detecting element. The present invention may be widely applied to an optical device in which a functional layer is sandwiched between a reflection electrode and a transparent electrode, and may also be applied not only to a light detecting element but also to a light emitting element.

The imaging systems described in the fifth and sixth embodiments are examples of an imaging system to which the photoelectric conversion device of the present invention may be applied, and the imaging system to which the photoelectric conversion device of the present invention may be applied is not limited to the configurations illustrated in FIG. 11 and FIG. 12A.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-125462, filed Jul. 22, 2020, which is hereby incorporated by reference herein in its entirety.

What is claimed is:

1. A light detecting element including a first electrode, a second electrode, and a photoelectric conversion film arranged between the first electrode and the second electrode, wherein the first electrode includes a first metal layer, a second metal layer arranged between the first metal layer and the photoelectric conversion film, and an oxide layer arranged between the second metal layer and the photoelectric conversion film and formed of an oxide of a metal that the second metal layer contains as a main component, and wherein a reflectance of the first electrode with respect to light having a certain wavelength transmitted through the photoelectric conversion film is higher than a reflectance specific to a material forming the second metal layer with respect to light having the certain wavelength.

2. The light detecting element according to claim 1 wherein the reflectance of the first electrode with respect to light having the certain wavelength transmitted through the photoelectric conversion film is not less than 0.6.

3. The light detecting element according to claim 1, wherein the second metal layer is thinner than the first metal layer.

4. The light detecting element according to claim 1, wherein a thickness of the second metal layer is 10 nm to 30 nm.

5. The light detecting element according to claim 1, wherein a relationship $\{(Na-1)^2+Ka^2\}/\{(Na+1)^2+Ka^2\} > \{(Nb-1)^2+Kb^2\}/\{(Nb+1)^2+Kb^2\}$ is satisfied, where Na is a refractive index of the first metal layer, Ka is an extinction coefficient of the first metal layer, Nb is a refractive index of the second metal layer, and Kb is an extinction coefficient of the second metal layer.

6. The light detecting element according to claim 1, wherein a relationship $Kb \times Tb \leq 0.183 \times \lambda b$ is satisfied, where Kb is an extinction coefficient of the second metal layer, Tb is a thickness of the second metal layer, and $\lambda b$ is a wavelength of light incident on the second metal layer.

7. The light detecting element according to claim 1, wherein the second metal layer is formed of a material in which an oxide of a metal or an alloy constituting the second metal layer has an electrical property that allows movement of carriers of a first conductivity type and restricts movement of carriers of a second conductivity type different from the first conductivity type.

8. The light detecting element according to claim 1, wherein the first metal layer is formed of a metal or an alloy containing aluminum or silver as a main component.

9. The light detecting element according to claim 1, wherein the second metal layer is formed of a metal or an alloy mainly containing at least one selected from the group consisting of titanium, zinc, and zirconium as a main component.

10. The light detecting element according to claim 1, further comprising an intermediate layer arranged between the first electrode and the photoelectric conversion film.

11. The light detecting element according to claim 10, wherein the intermediate layer includes an oxide, nitride, or oxynitride containing at least one selected from the group consisting of titanium, zinc, zirconium, and tantalum as a main component.

12. The light detecting element according to claim 1, wherein the second metal layer includes a first region having a first thickness and a second region having a second thickness larger than the first thickness,
 wherein the first thickness is 5 nm to 50 nm, and
 wherein the second thickness is greater than 50 nm.

13. The light detecting element according to claim 12, wherein the second region is arranged around the first region.

14. The light detecting element according to claim 12, wherein the first region of the second metal layer and the second region of the second metal layer are separated.

15. The light detecting element according to claim 1, wherein the second electrode includes a metal oxide layer.

16. The light detecting element according to claim 1, wherein the first metal layer is formed of a metal or an alloy containing aluminum as a main component,
 wherein the second metal layer is formed of a metal or an alloy containing titanium as a main component, and
 wherein a thickness of the second metal layer is not more than 40 nm.

17. A photoelectric conversion device comprising:
 a plurality of unit cells each including the light detecting element according to claim 1, and a readout circuit configured to readout a signal output from the light detecting element.

18. Equipment comprising:
 a photoelectric conversion device including the light detecting element according to claim 1, and a substrate supporting the light detecting element; and
 an information processing device configured to process information based on a signal output from the photoelectric conversion device.

19. The equipment according to claim 18, further includes a light source that emits light in an absorption wavelength band of the photoelectric conversion film.

20. The equipment according to claim 19, wherein the light in the absorption wavelength band of the photoelectric conversion film is infrared light.

21. A light detecting element including a first electrode, a second electrode, and a photoelectric conversion film arranged between the first electrode and the second electrode,
 wherein the first electrode includes a first metal layer, a second metal layer arranged between the first metal layer and the photoelectric conversion film, and an oxide layer arranged between the second metal layer and the photoelectric conversion film and formed of an oxide of a metal that the second metal layer contains as a main component,
 wherein the first metal layer is formed of a metal or an alloy containing aluminum or silver as a main component, and
 wherein a thickness of the second metal layer is 5 nm to 50 nm.

* * * * *